(12) United States Patent
Akahane

(10) Patent No.: US 9,294,093 B2
(45) Date of Patent: Mar. 22, 2016

(54) LEVEL SHIFT CIRCUIT UTILIZING RESISTANCE IN SEMICONDUCTOR SUBSTRATE

(71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/607,036

(22) Filed: Jan. 27, 2015

(65) Prior Publication Data
US 2015/0137852 A1    May 21, 2015

Related U.S. Application Data

(62) Division of application No. 13/989,784, filed as application No. PCT/JP2011/005099 on Sep. 9, 2011, now Pat. No. 8,975,944.

(30) Foreign Application Priority Data

Nov. 25, 2010   (JP) ................. 2010-262595

(51) Int. Cl.
| | |
|---|---|
| H03L 5/00 | (2006.01) |
| H03K 19/0175 | (2006.01) |
| H03K 3/356 | (2006.01) |
| H03K 17/687 | (2006.01) |
| H03K 17/0412 | (2006.01) |

(52) U.S. Cl.
CPC .. *H03K 19/017509* (2013.01); *H03K 3/356182* (2013.01); *H03K 17/04123* (2013.01); *H03K 17/687* (2013.01); *H03K 2217/0063* (2013.01)

(58) Field of Classification Search
CPC ............... H03K 19/017509; H03K 3/356182; H03K 17/687; H03K 17/04123; H03K 2217/0063
USPC ................... 327/306, 333; 326/82–83, 61–63
See application file for complete search history.

(56) References Cited

U.S. PATENT DOCUMENTS

| | | | |
|---|---|---|---|
| 5,801,418 A | 9/1998 | Ranjan | |
| 5,896,043 A | 4/1999 | Kumagai | |
| 5,917,359 A | 6/1999 | Fukunaga et al. | |
| 6,037,720 A | 3/2000 | Wong et al. | |

(Continued)

FOREIGN PATENT DOCUMENTS

| | | |
|---|---|---|
| EP | 1860763 A2 | 11/2007 |
| JP | H5-343980 | 12/1993 |

(Continued)

*Primary Examiner* — Dinh T Le
(74) *Attorney, Agent, or Firm* — Rabin & Berdo, P.C.

(57) ABSTRACT

An apparatus such as a level shift circuit includes a first signal output device configured to output a first level shifting signal, a second signal output device configured to output a second level shifting signal, and first and second detector devices. The level shifting signals are to control an output switching element of a high potential side of an output device that includes a power source and a load. The first and second detector devices are respectively configured to compare the first and second level shifting signals to a reference signal and output respective first and second comparison result signals. The first and second comparison result signals are configured to at least partly control switching of the first and second level shifting signals based at least in part on the presence of a parasitic resistance.

3 Claims, 26 Drawing Sheets

(56) References Cited

U.S. PATENT DOCUMENTS

| | | |
|---|---|---|
| 7,688,049 B2 * | 3/2010 | Iwabuchi et al. ............ 323/271 |
| 7,782,115 B2 | 8/2010 | Ochi |
| 8,044,699 B1 | 10/2011 | Kelly |
| 2003/0048116 A1 | 3/2003 | Suetsugu |

FOREIGN PATENT DOCUMENTS

| | | |
|---|---|---|
| JP | H09-172366 A | 6/1997 |
| JP | H9-200020 | 7/1997 |
| JP | 3214818 B2 | 7/2001 |
| JP | 3941206 B2 | 7/2007 |

* cited by examiner

US 9,294,093 B2

LEVEL SHIFT CIRCUIT UTILIZING RESISTANCE IN SEMICONDUCTOR SUBSTRATE

CROSS-REFERENCE TO THE RELATED APPLICATIONS

This is a divisional of U.S. application Ser. No. 13/989,784, which is, in turn, a national stage of PCT application number PCT/JP2011/005099, filed Sep. 9, 2011. Furthermore, this application claims the foreign priority benefit of Japanese application number JP PA 2010-262595, filed Nov. 25, 2010. The disclosures of these prior applications are incorporated herein by reference.

TECHNICAL FIELD

The present invention relates to a malfunction prevention method, a delay time shortening method, a current consumption reduction method, and a circuit area reduction method for a level shift circuit typified by a half bridge power supply.

BACKGROUND ART

In a half bridge circuit, or the like, in which switching elements are connected in series and which is driven by a high potential power supply, a level shift circuit is used in order that a high potential side switching element is driven by a low potential signal.

FIG. 1 shows a configuration diagram of a half bridge circuit 100 using a heretofore known level shift circuit. The half bridge circuit 100 shown in FIG. 1 is configured of an output circuit 110, a high potential side drive circuit 120, and a low potential side drive circuit 130. The output circuit 110 is connected to the high potential side drive circuit 120 and low potential side drive circuit 130. Also, synchronized signals are input from the exterior into each of the high potential side drive circuit 120 and low potential side drive circuit 130.

The output circuit 110 is configured of a switching element XD1, a switching element XD2, a power source E, and a load L1. In the output circuit 110, the switching element XD1 is connected in series to the switching element XD2, to which the load L1 is connected in parallel, and the high voltage power source E supplies power to the load L1 via the switching element XD1. The switching element XD1 is a high potential side switching element, and can be, for example, an n-channel or p-channel MOS transistor, a p-type or n-type IGBT (Insulated Gate Bipolar Transistor), or the like. The switching element XD2 is a low potential side switching element, and can be, for example, an n-channel MOS transistor, an n-type IGBT, or the like. Hereafter, the switching element XD1 and switching element XD2 will be assumed to be n-channel MOS transistors.

The high potential side drive circuit 120 is configured of a level shift circuit, a high side driver 123, and a power source E1 (hereafter, the output voltage thereof will also be expressed as E1). The level shift circuit is a portion of the high potential side drive circuit 120 excluding the high side driver 123 and power source E1, and is configured of a latch malfunction protection circuit 121, a latch circuit 122, a first series circuit 124, a second series circuit 125, feedback resistors R3, R4, R5, and R6 (the resistance values thereof are also taken to be R3, R4, R5, and R6 respectively), p-channel MOS transistors (hereafter expressed as PM) 1 and PM2, a diode D1 and diode D2, and an inverter INV.

The first series circuit 124 is configured of a level shift resistor R1 (the resistance value thereof is also taken to be R1) and a high breakdown voltage n-channel MOSFET (hereafter expressed as HVN) 1 connected in series, and outputs a level shift output signal setdrn (hereafter expressed as a setdrn signal) to the latch malfunction protection circuit 121 via a first connection point Vsetb (the potential thereof is also taken to be Vsetb). Herein, the first series circuit 124 includes a first level shift output terminal (corresponding to the first connection point Vsetb) for outputting the setdrn signal to the latch malfunction protection circuit 121, and the first level shift terminal is connected to the latch malfunction protection circuit 121.

The second series circuit 125 is configured of a level shift resistor R2 (the resistance value thereof is also taken to be R2) and an HVN2 connected in series, and outputs a level shift output signal resdrn (hereafter expressed as a resdrn signal) to the latch malfunction protection circuit 121 via the HVN2 and a second connection point Vrstb (the potential thereof is also taken to be Vrstb). Herein, the second series circuit 125 includes a second level shift output terminal (corresponding to the second connection point Vrstb) for outputting the resdrn signal to the latch malfunction protection circuit 121, and the second level shift terminal is connected to the latch malfunction protection circuit 121.

The PM1 is connected in parallel to the resistor R1 configuring the first series circuit 124. The PM2 is connected in parallel to the resistor R2 configuring the second series circuit 125.

A connection point of the feedback resistors R3 and R5 is connected to the gate terminal of the PM2, and a connection point of the feedback resistors R4 and R6 is connected to the gate terminal of the PM1. A feedback circuit is configured of the inverter INV, the feedback resistors R3, R4, R5, and R6, the PM1, and the PM2. Also, regarding the resistance values of the level shift resistors R1 and R2 and the feedback resistors R3, R4, R5, and R6, it is taken that R1=R2, R3=R4, and R5=R6.

The setdrn signal and resdrn signal are input into the latch malfunction protection circuit 121. The latch malfunction protection circuit 121 is a circuit that, when a false signal called dv/dt noise occurs because of source-to-drain parasitic capacitors Cds1 and Cds2 of the HVN1 and HVN2, that is, when the potential Vsetb and the potential Vrstb are both at an L (low) level, outputs at a high impedance so that the latch circuit 122 is not affected.

The latch circuit 122 is connected to the latch malfunction protection circuit 121 and high side driver 123. The latch circuit 122 is a circuit into which the output from the latch malfunction protection circuit 121 is input that stores and outputs the value of the input when the input is at an L or H level and, when the input is of a high impedance, holds and outputs the value stored immediately before the input reaches the high impedance.

The output terminal of the latch circuit 122 is connected via the feedback resistors R4 and R6 to the second connection point Vrstb, which is a connection point of the level shift resistor R2 and HVN2 configuring the second series circuit 125. Also, by inverting the output of the latch circuit 122 using the inverter INV, an output the inverse of the output of the latch circuit 122 is obtained. The output terminal of the inverter INV that outputs the inverted output is connected via the feedback resistors R3 and R5 to the first connection point Vsetb, which is a connection point of the level shift resistor R1 and HVN1 configuring the first series circuit 124.

The high side driver 123 is connected to the high potential side switching element XD1 and latch circuit 122, and outputs a signal HO in accordance with the output of the latch circuit 122, thereby controlling the turning on and off of the switching element XD1.

The output terminal of the high side driver 123 is connected to the gate terminal of the switching element XD1. The latch malfunction protection circuit 121, the latch circuit 122, the high side driver 123, and the low potential side power source terminal of the power source E1 are connected to a connection point vs (hereafter, the potential thereof will also be expressed as vs) of the switching elements XD1 and XD2. Also, the latch malfunction protection circuit 121, latch circuit 122, and high side driver 123 receive a supply of power from the power source E1. In the same way, although not shown, the low potential side power source terminal of the inverter INV is also connected to the connection point vs, and receives a supply of power from the power source E1.

One end of each of the first series circuit 124 and second series circuit 125 is connected to a power source line vb (hereafter, the potential thereof will also be expressed as vb) connected to the high potential side terminal of the power source E1, while the other end of each is connected to a ground potential (GND). A set signal, which is a signal input into the level shift circuit of the high potential side drive circuit 120, is input into the gate of the HVN1, while a reset signal, which is a signal input into the level shift circuit of the high potential side drive circuit 120, is input into the gate of the HVN2.

The anodes of the diodes D1 and D2 are connected to the connection point vs of the switching elements XD1 and XD2, the cathode of the diode D2 is connected to the first connection point Vsetb, and the cathode of the diode D1 is connected to the second connection point Vrstb. The diodes D1 and D2 are for clamping the voltages Vsetb and Vrstb so that they do not drop to or below the potential vs, thus protecting the latch malfunction protection circuit 121 by ensuring that no overvoltage is input.

The feedback resistors R5 and R6 are connected to the vb potential or vs potential via a PMOS or NMOS of a CMOS circuit or logic inversion CMOS circuit (INV) used in the latch circuit 122, but for the sake of simplicity, the PMOS and NMOS are not shown in the latch circuit 122, and in the same way, will not be shown hereafter.

The low potential side drive circuit 130 is configured of a low side driver 131 that controls the turning on and off of the low potential side switching element XD2, and a power source E2 (hereafter, the potential thereof will also be expressed as E2) that supplies power to the low side driver 131.

The low side driver 131 is supplied with power from the power source E2, amplifies a signal S input into the low side driver 131, and inputs it into the gate terminal of the switching element XD2. According to this configuration, the switching element XD2 is turned on (energized) when the signal S is at an H (high) level, and the switching element XD2 is turned off (cut off) when the signal S is at an L (low) level. That is, the signal S is a signal that directly commands the turning on or off of the switching element XD2.

Of the set signal and reset signal input into the high potential side drive circuit 120, the set signal is a signal that indicates the timing of the start of an on-state period (the end of an off-state period) of the switching element XD1, while the reset signal is a signal that indicates the timing of the start of an off-state period (the end of an on-state period) of the switching element XD2.

The switching elements XD1 and XD2 are turned on and off in a complementary way such that when one is in an on-state the other is in an off-state, except during a dead time to be described hereafter, with the potential vs of the connection point vs reaching the ground potential when the switching element XD2 is in an on-state, and the potential vs of the connection point vs reaching the output voltage E of the power source E when the switching element XD1 is in an on-state. Also, the load L1 is a load that receives a supply of power from the half bridge circuit 100, and is connected between the connection point vs and the ground potential.

In the kind of heretofore known half bridge circuit 100 shown in FIG. 1, it is often the case that there is a large difference in potential of in the region of several hundred volts between the low potential side power source voltage E2 and high potential side power source voltage E1. Because of this, it may happen that the difference in potential occurs between wiring linking the high potential side circuit and low potential side circuit and a semiconductor forming an underlay of the wiring. In particular, when the wiring potential is a high voltage due to the high potential side circuit and a subsequent stage is a low potential side circuit region, voltage generation and the effect thereof are marked. When simply applying metal wiring of a semiconductor as the wiring linking the high potential side circuit and low potential side circuit, a high electric field is generated between the wiring and the semiconductor immediately below, and various problems occur in the level shift circuit. In order to solve the heretofore described kind of problem, it is possible to apply a wire bonding method in the level shift circuit. A wire bonding method is a method whereby the drain of the HVN1 and the first connection point Vsetb, and the drain of the HVN2 and the second connection point Vrstb, are connected by wiring in, for example, FIG. 1. As the wiring is point-to-point wiring distanced from the semiconductor when using a wire bonding method, it is possible to prevent a high electric field from being generated in the semiconductor region forming the underlay.

However, the application of a wire bonding method has a detrimental effect on the cost of the level shift circuit and on downsizing the product due to, for example, an increase in man-hours, the need for wiring space, and the like. Consequently, there is a demand for a level shift circuit that does not use a wire bonding method. The technologies shown in PTL 1 and PTL 2 (identified below) exist as level shift circuits that do not use a wire bonding method.

CITATION LIST

Patent Literatures

PTL 1: Japanese Patent No. 3,941,206
PTL 2: Japanese Patent No. 3,214,818

A high breakdown voltage IC having a device configuration wherein HVNs are embedded in a high breakdown voltage separation portion (hereafter referred to as an HVJT), and having parasitic resistors (R1 in FIG. 3 of PTL 1) configured in parallel with level shift resistors configuring a level shift circuit, and a technology for controlling the resistance value of the parasitic resistors used in the level shift circuit, are described in PTL 1. FIG. 2 shows a configuration of the level shift circuit shown in PTL 1. The same reference signs are given to regions the same as in FIG. 1, and a detailed description will be omitted. As shown in FIG. 2, the level shift circuit shown in PTL 1 differs from the level shift circuit shown in FIG. 1 in that it includes, in addition to level shift resistors LSR1 and LSR2, parasitic resistors LSRp1, LSRp2, and LSRp3. A first series circuit of the parallel resistance of the level shift resistor LSR1 and parasitic resistor LSRp1 and the HVN1, and a second series circuit of the parallel resistance of the level shift resistor LSR2 and parasitic resistor LSRp2 and the HVN2, are configured in the level shift circuit shown in PTL 1. The resistance values of the parasitic resistor LSRp1 configured in parallel with the level shift resistor LSR1 and the parasitic resistor LSRp2 configured in parallel with the resistor LSR2 can be controlled in the level shift circuit shown in PTL 1.

A high voltage power integrated circuit having a device configuration, differing from that in PTL 1, wherein a level shift from a low potential signal to a high potential signal is made without using wire bonding, wherein a level shift operation is possible, and that does not have a metal crossover, is described in PTL 2.

The technologies described in PTL 1 and PTL 2 are both such that the circuit area is reduced by embedding the HVNs in the HVJT region, thereby realizing a high voltage breakdown IC. Also, the kinds of method shown in PTL 1 and PTL 2 that do not use a wire bonding method differ from the wire bonding method in terms of device structure in that parasitic resistors corresponding to the level shift resistors are added, and that a parasitic resistor is added between the two series circuits.

However, the technology described in PTL 1 is such that the first series circuit and second series circuit have the same circuit configuration and device configuration. Because of this, a malfunction occurs due to the drain potentials of the turn-on signal side HVN and turn-off signal side HVN both exceeding the threshold value of a logic circuit at a subsequent stage due to the effect of the current flowing into the parasitic capacitor Cds1 of the HVN1 and the parasitic capacitor Cds2 of the HVN2 when dV/dt noise occurs. When reducing the resistance value of the level shift resistors in order to avoid this malfunction, the current flowing through the level shift resistors increases when an HVN is turned on and dV/dt noise occurs, and current consumption increases. Also, when the resistance value of the level shift resistors is not reduced, it is necessary to strengthen a noise cancellation function such as a low-pass filter in order to prevent a malfunction caused by level shift output fluctuation due to the occurrence of dv/dt noise, and there is a problem in that delay time increases because of the effect of the noise cancellation function.

Also, the technology described in PTL 2 too, in the same way as the technology described in PTL 1, is such that the first series circuit and second series circuit have the same circuit configuration and device configuration, because of which there is the problem of malfunction when dV/dt noise occurs, or the like, the problem of power consumption increasing due to reducing the resistance value of the level shift resistors in order to avoid malfunction, and the problem of delay time increasing due to strengthening the noise cancellation function when the resistance value of the level shift resistors is not reduced.

Consideration will be given to a case of replacing the level shift resistors of the heretofore known level shift circuit with the parasitic resistors described in PTL 1 or PTL 2 in order to avoid wire bonding and reduce the circuit area. FIG. 3 shows an example wherein the heretofore known level shift circuit shown in FIG. 1 is configured using the HVN-embedded type of HVJT described in PTL 1. The same reference signs are given to regions the same as in FIG. 1, and a detailed description will be omitted. The main difference between a high potential side drive circuit 220 of a half bridge circuit 200 shown in FIG. 3 and the high potential side drive circuit 120 of the half bridge circuit 100 shown in FIG. 1 is the adoption of a configuration wherein the feedback resistors R3 and R4 are eliminated, the level shift resistor R1 is replaced with a parasitic resistor Rpar1 in the semiconductor substrate, the level shift resistor R2 is replaced with a parasitic resistor Rpar2 in the semiconductor substrate, and a parasitic resistor Rpar3 is connected between a first series circuit 221 and second series circuit 222. The first series circuit 221 is configured of the PM1 or parasitic resistor Rpar1 and the HVN1, while the second series circuit 222 is configured of the PM2 or parasitic resistor Rpar2 and the HVN2. By applying the device structure described in PTL 1, PTL 2, and the like in this way, it is possible to configure a level shift circuit without using wire bonding in the half bridge circuit 200 shown in FIG. 3.

The resistance value of the parasitic resistors varies depending on temperature, power source voltage, and the like. FIG. 4 shows the temperature dependency of the parasitic resistor resistance value. As shown in FIG. 4, the parasitic resistor resistance value is 3 kΩ when the temperature is −50° C., while the resistance value is 10 kΩ when the temperature is 150° C. FIG. 5 shows the power source voltage dependency of the parasitic resistor resistance value. As shown in FIG. 5, the parasitic resistor resistance value is 3 kΩ when the voltage between the vb and GND is 0V, while the resistance value is 30 kΩ when the voltage between the vb and GND is 800V. In this way, the resistance value of the parasitic resistors, which are resistors in the semiconductor substrate, has temperature dependency and power source voltage dependency. Because of this, the rise time of the setdrn signal and resdrn signal varies in accordance with the temperature and power source voltage conditions, which may affect the operation of the level shift circuit, as will be described hereafter.

Also, the resistance value of the parasitic resistor Rpar3 provided between the first series circuit 221 and second series circuit 222 varies depending on the distance between the HVN1 and HVN2. FIG. 6 shows the dependency of the parasitic resistor Rpar3 resistance value on the distance between the HVN1 and HVN2. As shown in FIG. 6, the parasitic resistor Rpar3 resistance value is 500 kΩ when the distance between the HVN1 and HVN2 is 1,000 μm.

In the level shift circuit shown in FIG. 3, the resistance value of the parasitic resistors Rpar1 and Rpar2 is regulated so as to be around 10 kΩ, while the resistance value of the parasitic resistor Rpar3 is regulated so as to be around 500 kΩ. When the resistance value of the parasitic resistor Rpar3 is on the high side, it is possible to reduce the effect when the level shift circuit carries out each operation.

The half bridge circuit 200 shown in FIG. 3 can change the potential at one end of the feedback resistors R5 and R6 to the vb potential or the vs potential in accordance with the latch circuit 122 output status by changing the connection status of the feedback resistors R5 and R6 in accordance with the latch circuit 122 output status. FIG. 7 shows an equivalent circuit diagram of the level shift circuit shown in FIG. 3 when an output HO of the high side driver 123 is at an L level, while FIG. 8 shows an equivalent circuit diagram of the level shift circuit shown in FIG. 3 when the output HO is at an H level. As shown in FIG. 7, when the output HO is at an L level, the parasitic resistor Rpar1 and feedback resistor R5 are in a condition wherein they are connected in parallel, while the parasitic resistor Rpar2 and feedback resistor R6 are in a condition wherein they are connected in series. Consequently, by the gate potential of the PM1 becoming lower than the potential vb and the PM1 ceasing to be in a cut off state, the impedance of the output terminal of the first series circuit 221 decreases, and by the gate potential of the PM2 becoming the potential vb and the PM1 becoming cut off, the impedance of the output terminal of the second series circuit 222 increases. As shown in FIG. 8, when the output HO is at an H level, the parasitic resistor Rpar1 and feedback resistor R5 are in a condition wherein they are connected in series, while the parasitic resistor Rpar2 and feedback resistor R6 are in a condition wherein they are connected in parallel. Consequently, by the gate potential of the PM1 becoming the potential vb and the PM1 becoming cut off, the impedance of the output terminal of the first series circuit 221 increases, and by the gate potential of the PM2 becoming lower than the potential vb and the PM1 ceasing to be in a cut off state, the impedance of the output terminal of the second series circuit 222 decreases.

FIG. 9 shows an operation time chart of the level shift circuit shown in FIG. 3. On the input pulse of the set signal switching to an H level at a time $t_1$, the setdrn signal drops to the vs potential, and the latch output starts to rise to an H level. While the input pulse of the set signal is at an H level, the setdrn signal continues to be at the vs potential level. On the output of the latch circuit 122 switching from an L level to an H level at a time $t_2$, the parallel/series condition of the feedback resistors R5 and R6 switches. On the input pulse of the set signal switching from an H level to an L level at a time $t_3$, the setdrn signal rises. On the input pulse of the reset signal switching to an H level at a time $t_4$, the resdrn signal drops to the vs potential, and the latch output starts to fall to an L level. While the input pulse of the reset signal is at an H level, the resdrn signal continues to be at the vs potential level. On the output of the latch circuit 122 switching from an H level to an L level at a time $t_5$, the parallel/series condition of the feedback resistors R5 and R6 switches. On the input pulse of the reset signal switching from an H level to an L level at a time $t_6$, the resdrn signal rises.

When the timing of the inversion (setting) of the output of the latch circuit 122 is earlier than the input pulse width of the set signal, the impedance of the output terminal of the first series circuit 221 when the setdrn signal starts to rise becomes high, as heretofore described, the time constant of a time constant circuit configured of this and the parasitic capacitor Cds1 increases, and the rise of the setdrn signal is delayed.

Also, when utilizing the parasitic resistors Rpar1 and Rpar2 as level shift resistors, the rise time fluctuates due to the effect of temperature and power source voltage, as heretofore described. As shown in FIG. 4 and FIG. 5, the resistance value of the parasitic resistors Rpar1 and Rpar2 increases when the temperature or voltage rises. When the resistance value of the parasitic resistors Rpar1 and Rpar2 increases, the delay in the rise of the setdrn signal and resdrn signal increases, but provided that the pulses of the set signal and reset signal are generated singly, there is no problem however long the rise of the setdrn signal and resdrn signal is delayed. However, when the resistance value of the parasitic resistors Rpar1 and Rpar2 is high, the pulse interval between the set signal and reset signal is short, the pulses of the set signal and reset signal are generated continuously, and the next pulse falls before the previous pulse has finished rising, both the setdrn signal and resdrn signal will be at an L level. As dV/dt noise is generated when both the setdrn signal and resdrn signal are at an L level, it is arranged, in order to combat the generation of dV/dt noise, that the latch malfunction protection circuit 121 does not transmit this state to a subsequent circuit. Consequently, as the subsequent pulse does not become effective until the previous pulse has finished rising, the delay time increases, as shown in FIG. 9, and responsiveness worsens.

FIG. 10 shows circuit simulation results for the half bridge circuit 200 shown in FIG. 3 when the pulse interval between the set signal and reset signal is 0.5 μs. FIG. 11 shows circuit simulation results for the half bridge circuit 200 shown in FIG. 3 when the pulse interval between the set signal and reset signal is 0.2 μs. As shown in FIG. 10, when the pulse interval between the set signal and reset signal is 0.5 μs, the latch output waveform shown by the broken line when the parasitic resistor resistance value is 5 kΩ, and the latch output waveform shown by the solid line when the parasitic resistor resistance value is 35 kΩ, are the same.

However, as shown in FIG. 11, when comparing the output waveform when the parasitic resistor resistance value is 5 kΩ and the output waveform when the parasitic resistor resistance value is 35 kΩ when the pulse interval between the set signal and reset signal is 0.2 μs, it can be seen that a delay occurs in the latch output waveform when the parasitic resistor resistance value is 35 kΩ.

SUMMARY

The invention provides a level shift circuit that does not affect delay time, regardless of the size of parasitic resistor resistance value.

In order to solve the heretofore described problem, the invention according to a first aspect is a level shift circuit, characterized by including a first series circuit wherein a first resistor in a semiconductor substrate, a first switching element connected to an input terminal that inputs a first level shift input signal, and a first level shift output terminal for outputting a first level shift output signal are connected in series, a second series circuit wherein a second resistor in a semiconductor substrate, a second switching element connected to an input terminal that inputs a second level shift input signal, and a second level shift output terminal for outputting a second level shift output signal are connected in series, a rise detector circuit, connected to the first series circuit and second series circuit and into which are input the first level shift output signal and second level shift output signal output from the first series circuit and second series circuit respectively, that compares the rise potential of the first level shift output signal and second level shift output signal with a predetermined threshold value, and outputs a first output signal and second output signal, which are pulse outputs of a constant duration, when the threshold value is exceeded, a third switching element connected in parallel to the first resistor, wherein the source terminal of the third switching element is connected to a power source potential, the drain terminal of the third switching element is connected to the first level shift output terminal, and the gate terminal of the third switching element is connected to the rise detector circuit, and a fourth switching element connected in parallel to the second resistor, wherein the source terminal of the fourth switching element is connected to a power source potential, the drain terminal of the fourth switching element is connected to the second level shift output terminal, and the gate terminal of the fourth switching element is connected to the rise detector circuit, wherein the third switching element is turned on by the first output signal from the rise detector circuit, and the fourth switching element is turned on by the second output signal from the rise detector circuit.

The level shift circuit according to a second aspect is the level shift circuit according to the first aspect, characterized in that the first resistor and second resistor are parasitic resistors in the semiconductor substrate.

The level shift circuit according to a third aspect is the level shift circuit according to the first or second aspects, characterized by including a logic circuit that outputs a third output signal when either of the first output signal or second output signal is output from the rise detector circuit, wherein a dead time is provided for the input times of the first level shift input signal and second level shift input signal, the output pulse width of the rise detector circuit is equal to or less than the dead time, and the third switching element and fourth switching element are turned on when the third output signal is output.

The level shift circuit according to a fourth aspect is the level shift circuit according to any one of the first to third aspects, characterized by further including a latch malfunction protection circuit, into which the first level shift output signal and second level shift output signal are input, that outputs a high impedance signal when both the first level shift output signal and second level shift output signal are at an L level, and a latch circuit, into which an output from the latch malfunction protection circuit is input, that stores and outputs the value of the output from the latch malfunction protection circuit when the output is at an L or H level and, when the output from the latch malfunction protection circuit is of a high impedance, holds the value stored immediately before the input reaches the high impedance, and outputs the stored value together with an inverse signal of the stored value, wherein one output terminal of the latch circuit is connected via a first feedback resistor to the first level shift output terminal, and the other output terminal is connected via a second feedback resistor to the second level shift output terminal.

The level shift circuit according to a fifth aspect is the level shift circuit according to any one of the first to fourth aspects, characterized by further including a first feedback transistor connected in parallel to the first resistor and a second feedback transistor connected in parallel to the second resistor, wherein the gate of the first feedback transistor is connected to the second level shift output terminal, and the gate of the second feedback transistor is connected to the first level shift output terminal.

Advantageous Effects of Invention

According to the invention according to the first aspect, it is possible to reduce delay time to a minimum, even when using resistors with temperature characteristics and power source voltage characteristics as level shift resistors. Also, it is possible to shorten the pulse input interval between a set side pulse input and a reset side pulse input.

According to the invention according to the second aspect, it is possible to use parasitic resistors with temperature characteristics and power source voltage characteristics as level shift resistors.

According to the invention according to the third aspect, it is possible to prevent shoot-through current when the level shift circuit according to the first aspect is operating.

According to the invention according to the fourth and fifth aspects, it is possible to prevent malfunction caused by dV/dt noise.

DETAILED DESCRIPTION

Example 1

Figure 1:
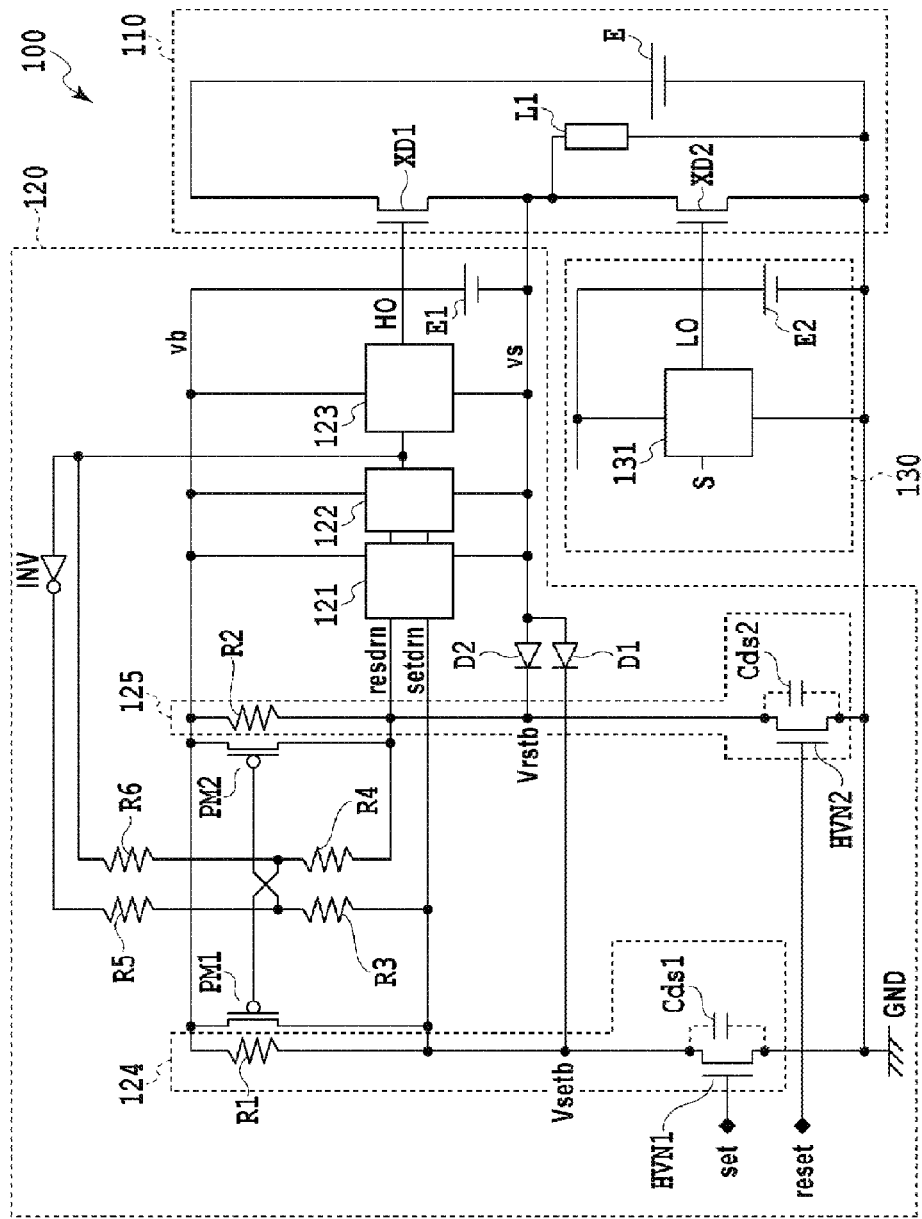
FIG. 1 shows a configuration diagram of a half bridge circuit using a heretofore known level shift circuit.
Figure 2:
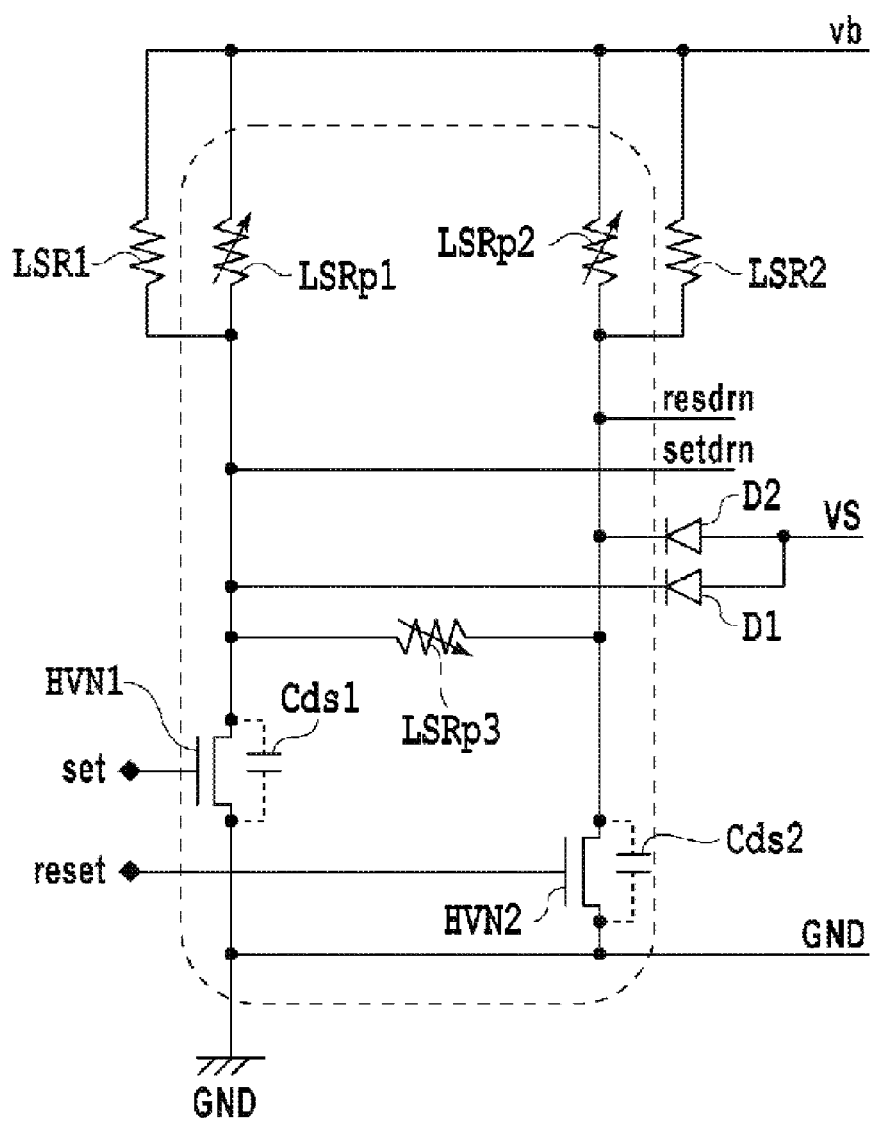
FIG. 2 shows a configuration diagram of the heretofore known level shift circuit.
Figure 3:
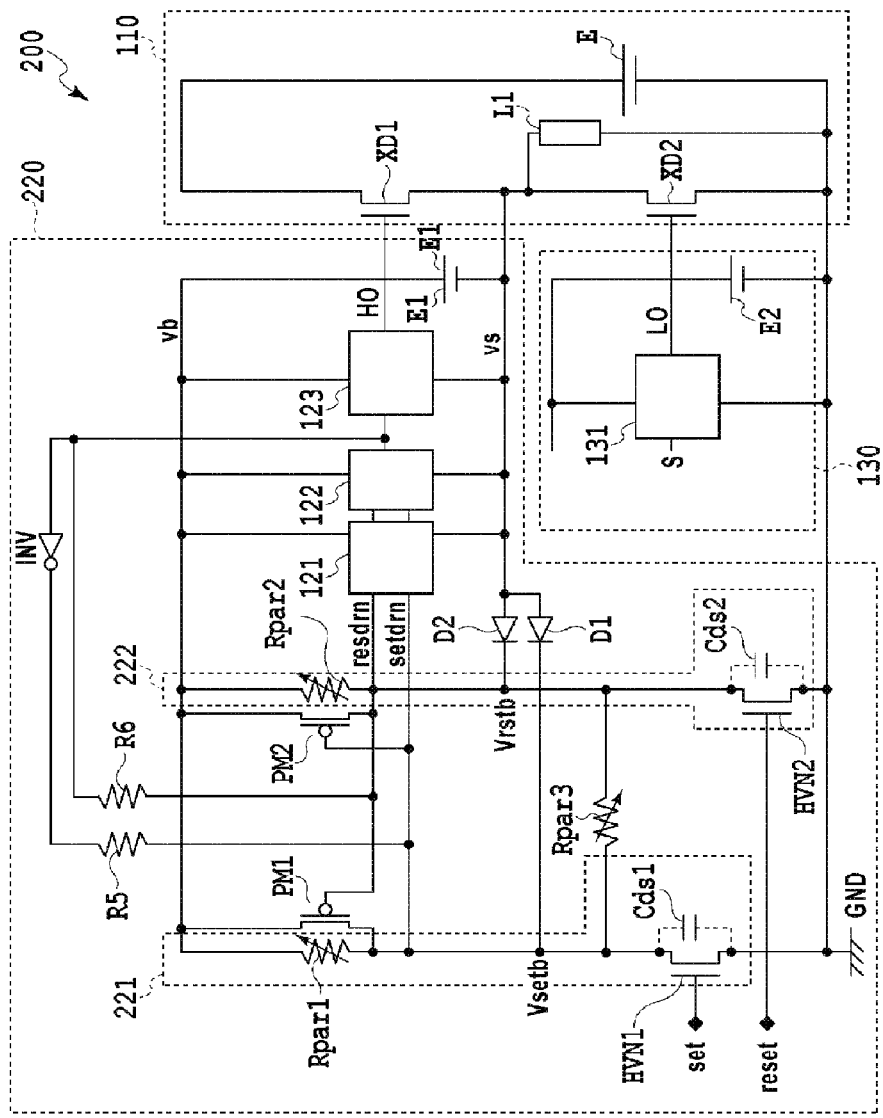
FIG. 3 shows a circuit configuration diagram when level shift resistors in the heretofore known level shift circuit configuration are replaced with parasitic resistors.
Figure 4:
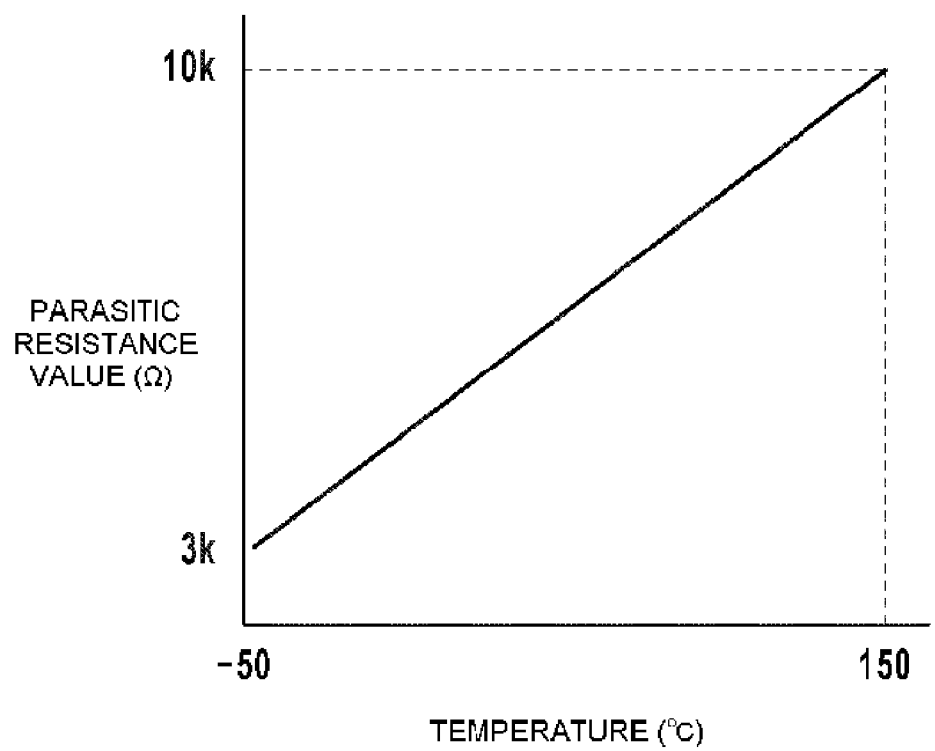
FIG. 4 is a diagram showing the temperature dependency of parasitic resistor resistance value.
Figure 5:
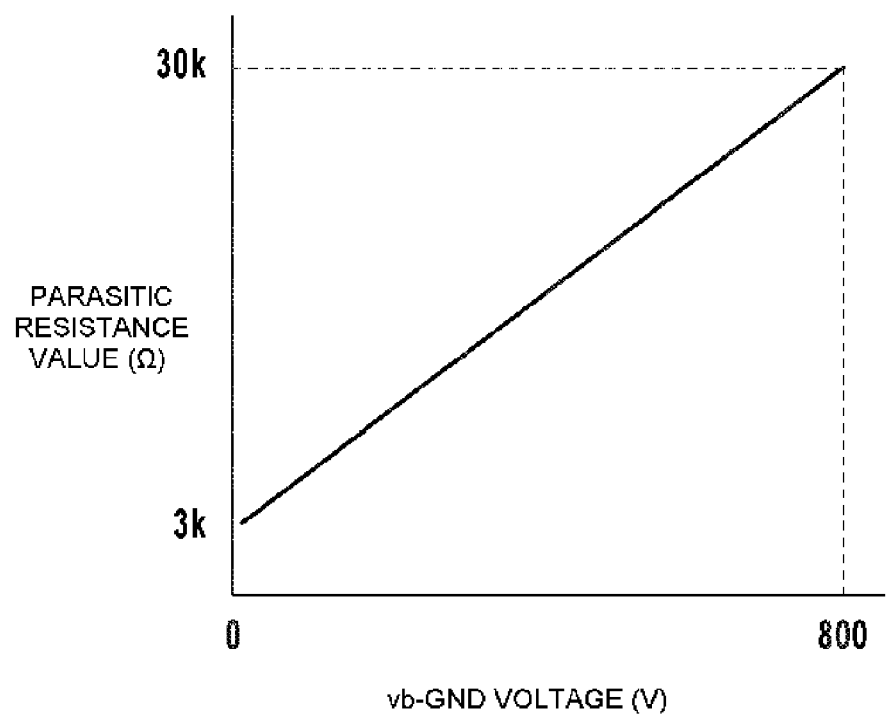
FIG. 5 is a diagram showing the voltage dependency of parasitic resistor resistance value.
Figure 6:
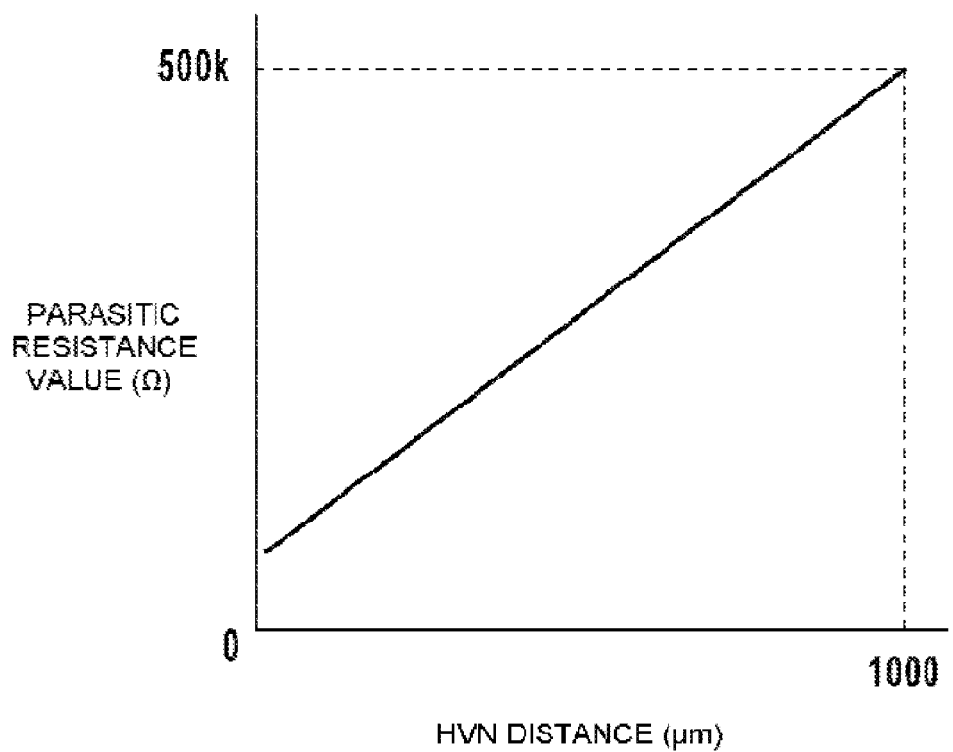
FIG. 6 is a diagram showing the dependency of parasitic resistor resistance value on the distance between HVNs.
Figure 7:
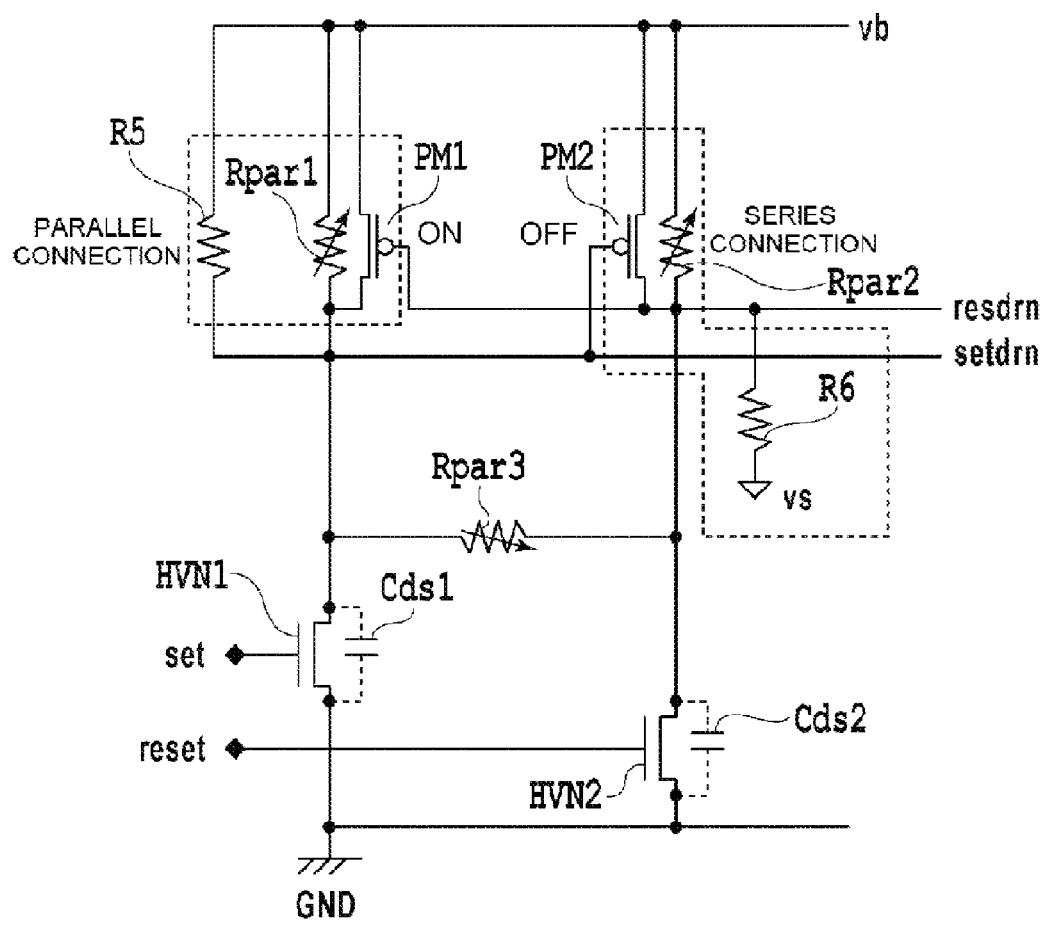
FIG. 7 shows an equivalent circuit diagram of the circuit configuration shown in FIG. 3 when a feedback resistor R5 and parasitic resistor Rpar1 are in a condition in which they are connected in parallel, while a feedback resistor R6 and parasitic resistor Rpar2 are in a condition in which they are connected in series.
Figure 8:
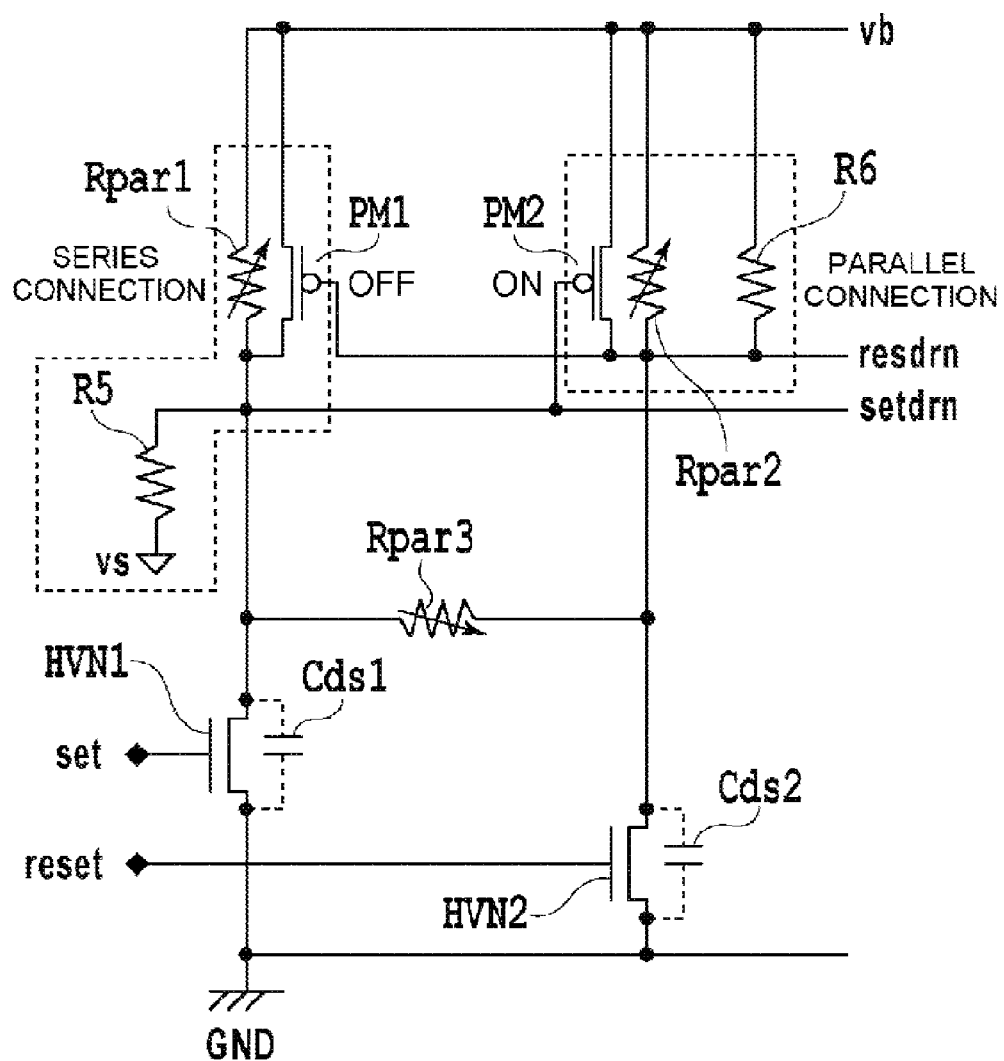
FIG. 8 shows an equivalent circuit diagram of the circuit configuration shown in FIG. 3 when the feedback resistor R5 and parasitic resistor Rpar1 are in a condition in which they are connected in series, while the feedback resistor R6 and parasitic resistor Rpar2 are in a condition in which they are connected in parallel.
Figure 9:
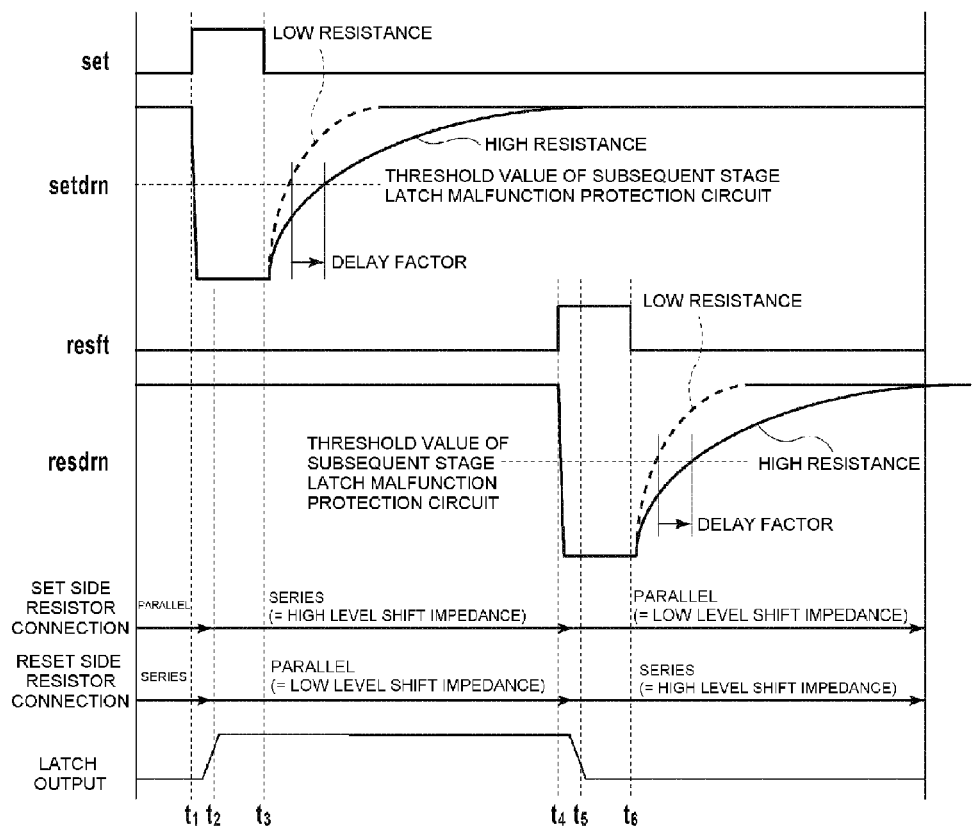
FIG. 9 shows an operation time chart of the level shift circuit shown in FIG. 3.
Figure 12:
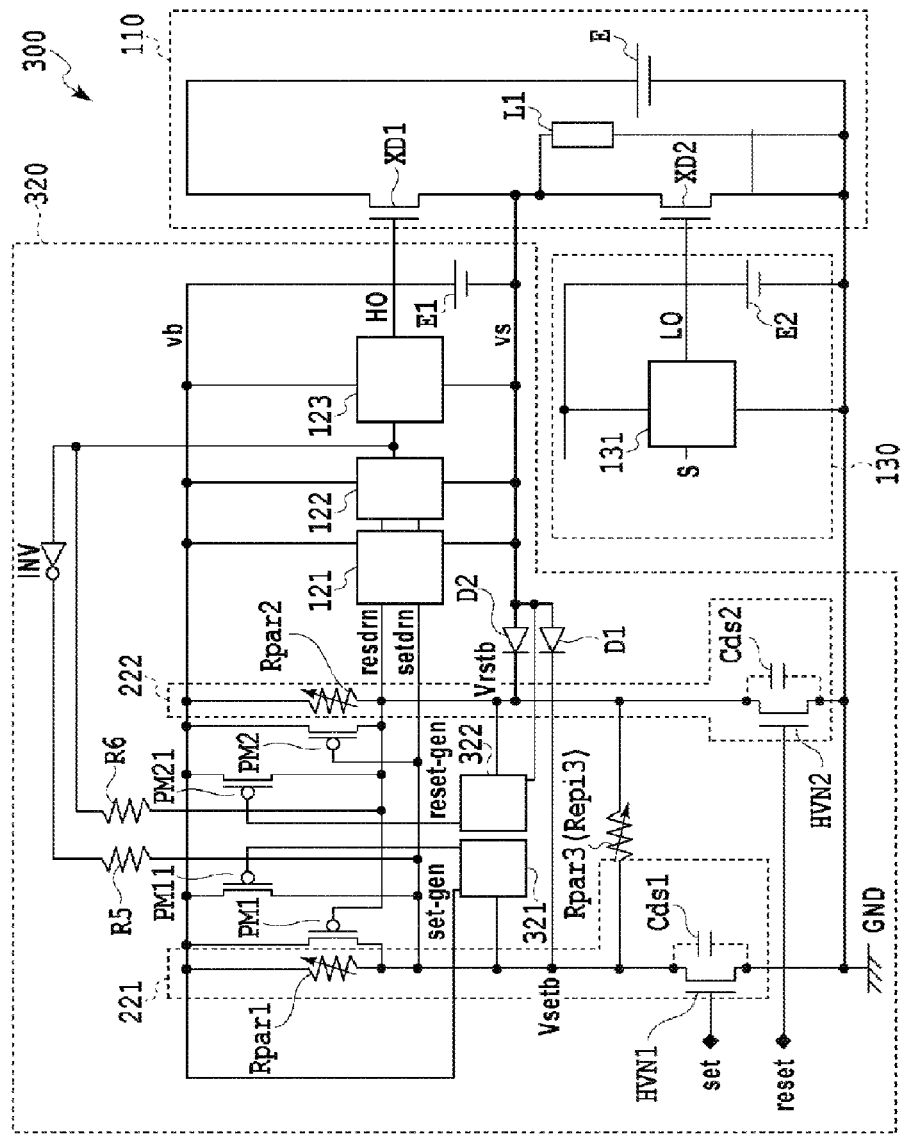
FIG. 12 shows a circuit configuration diagram according to Example 1 of the invention.

FIG. 12 is a circuit configuration diagram according to Example 1 of the invention. The same reference signs are given to regions the same as in FIG. 3, and a detailed description will be omitted. As shown in FIG. 12, a half bridge circuit 300 according to Example 1 of the invention differs from a half bridge circuit 200 shown in FIG. 3 in that the half-bridge circuit 300 further includes a PM11, a PM21, a first rise detector circuit 321, and a second rise detector circuit 322. The resistance values of parasitic resistors Rpar1 and Rpar2 in a high potential side drive circuit 320 of the half-bridge circuit 300 shown in FIG. 12 can be controlled as described in PTL 1. As one example, the parasitic resistors Rpar1 and Rpar2 at a predetermined power source voltage and predetermined temperature conditions are taken to be of 10 kΩ, taking into consideration the temperature characteristics shown in FIG. 4 and power source voltage characteristics shown in FIG. 5. The resistance value of a parasitic resistor Rpar3 at a predetermined power source voltage and predetermined temperature, based on the dependency on the distance between HVN1 and HVN2 shown in FIG. 6, is taken to be the 500 kΩ when the distance between HVN1 and HVN2 is 1,000 μm.

The first rise detector circuit 321 is connected to a first series circuit 221 and the gate terminal of the PM11, detects a rise of a setdrn signal output from the first series circuit 221, and inputs a set-gen signal into the gate terminal of the PM11. The second rise detector circuit 322 is connected to a second series circuit 222 and the gate terminal of the PM21, detects a rise of a resdrn signal output from the second series circuit 222, and inputs a reset-gen signal into the gate terminal of the PM21.

The PM11 is connected in parallel with the parasitic resistor Rpar1 of the first series circuit 221, while the PM21 is connected in parallel with the parasitic resistor Rpar2 of the second series circuit 222. The gate terminal of the PM11 is connected to the output terminal of the first rise detector circuit 321, while the gate terminal of the PM21 is connected to the output terminal of the second rise detector circuit 322.

Figure 13:
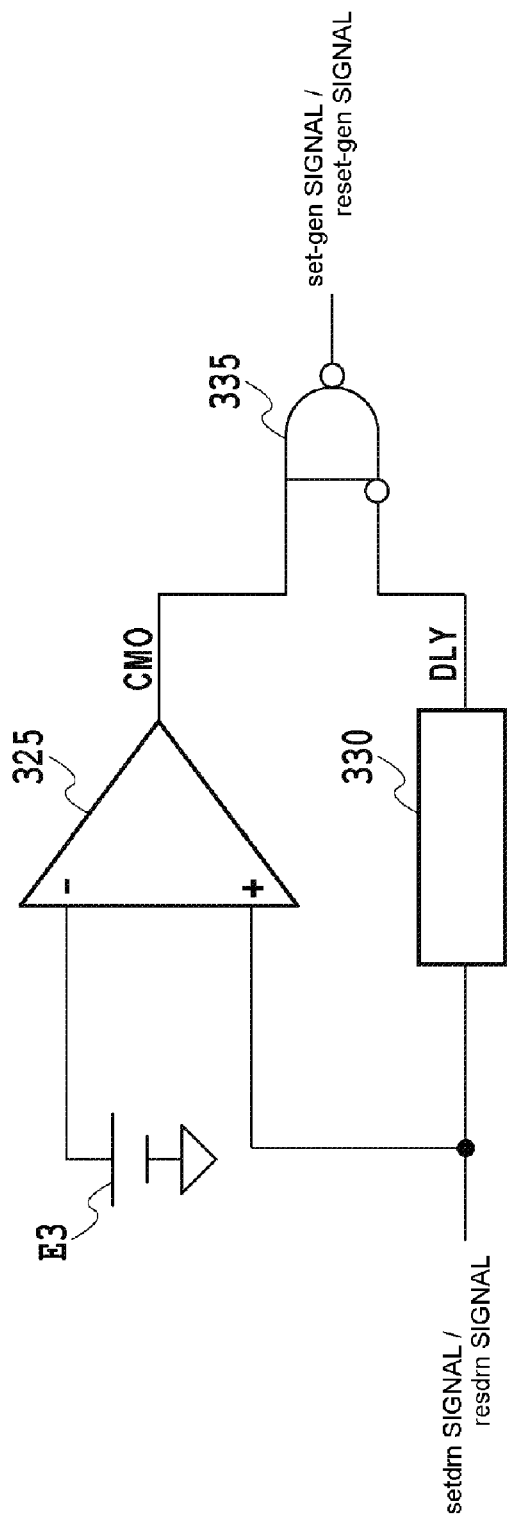
FIG. 13 shows an internal configuration diagram of a rise detector circuit.

FIG. 13 is an internal configuration diagram of the first rise detector circuit 321 and second rise detector circuit 322. As shown in FIG. 13, the first rise detector circuit 321 and second rise detector circuit 322 are configured of a delay circuit 330, a comparator 325, a PMOS gate signal connection terminal logic circuit 335, and a threshold value voltage source E3. The first rise detector circuit 321 differs from the second rise detector circuit 322, which inputs the resdrn signal and outputs the reset-gen signal, only in that it inputs the setdrn signal and outputs the set-gen signal. Hereafter, in order to describe the configuration of a rise detector circuit, a description will be given using the first rise detector circuit 321 as an example, but the same operation is carried out in the second rise detector circuit 322 too, except that the input signals and output signals differ, as heretofore described.

When the setdrn signal is input into the first rise detector circuit 321, the setdrn signal is input into the comparator 325 and delay circuit 330. The comparator 325 is such that the setdrn signal is input into one input terminal thereof while a threshold value voltage E3 from the threshold value voltage source E3 (the output voltage thereof is also taken to be E3) is input into the other input terminal, and the comparator 325 compares the setdrn signal and threshold value voltage E3. The comparator 325 inputs a comparison signal CMO into the PMOS gate signal connection terminal logic circuit 335, with the comparison signal CMO being at an H level when the signal level of the setdrn signal is higher than the threshold value voltage, and with the comparison signal CMO being at an L level when the signal level of the setdrn signal is lower than the threshold value voltage.

The delay circuit 330 delays the input setdrn signal, and inputs it into the PMOS gate signal connection terminal logic circuit 335 as a delay signal DLY. The delay circuit 330 is realized by, for example, a delay circuit using a method whereby the number of stages of a CMOS logic inverter is changed, a delay circuit wherein a resistive element and capacitive element are combined, a delay circuit using a method whereby the parameters of a resistive element and capacitive element are changed, or the like. The rise detector circuit may be configured so that, by the comparison signal CMO from the comparator 325 being input into the delay circuit 330, the signal CMO rather than the setdrn signal is delayed.

The input terminal of the PMOS gate signal connection terminal logic circuit 335 into which the delay signal DLY is input is set to have a function of inverting and inputting the delay signal DLY, while the output terminal that outputs the set-gen signal has a function of inverting the logical product of the comparison signal CMO and the inverted delay signal DLY, and outputting the set-gen signal. That is, the comparison signal CMO and delay signal DLY are input into the PMOS gate signal connection terminal logic circuit 335, the PMOS gate signal connection terminal logic circuit 335 sets the set-gen signal at an L level only when the comparison signal CMO is at an H level and the delay signal DLY is at an L level, sets the set-gen signal at an H level at all other times, and inputs the set-gen signal into the gate terminal of the PM11. In the same way, the second rise detector circuit 322 too, going through the same operation as in the case of the first rise detector circuit 321, but with the resdrn signal as an input, inputs the reset-gen signal into the gate terminal of the PM21.

Figure 14:
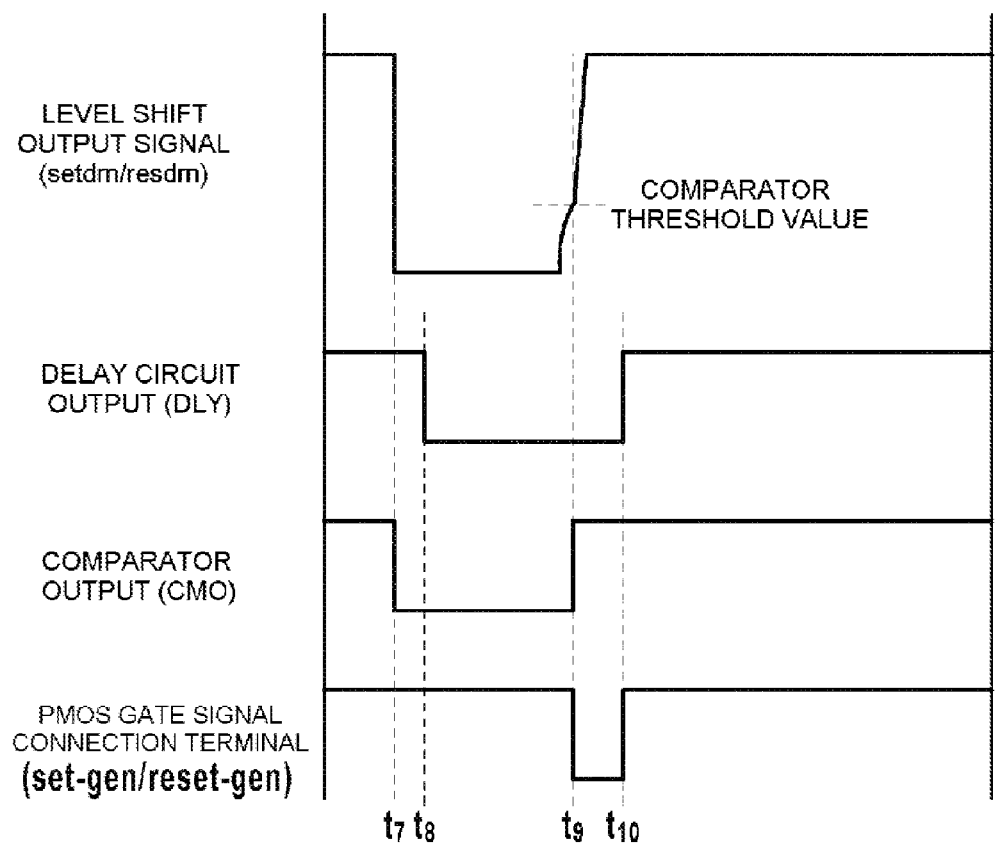
FIG. 14 shows an operation time chart of the rise detector circuit shown in FIG. 13.

FIG. 14 shows an operation time chart of the rise detector circuit shown in FIG. 13. As shown in FIG. 14, on the setdrn signal or resdrn signal being switched from an H level to an L level at a time $t_7$, the comparison signal CMO is also switched from an H level to an L level. The delay signal DLY is switched from an H level to an L level at a time $t_8$. On the setdrn signal or resdrn signal starting to rise to an H level, the signal level becoming higher than the threshold value voltage E3 at a time $t_9$, and the comparison signal CMO being switched to an H level, the set-gen signal or reset-gen signal is switched from an H level to an L level. Then, as a PM1 or PM2 is turned on (energized), the set-gen signal or reset-gen signal rises swiftly, and the rise time is shortened. On the delay signal DLY switching to an H level at a time $t_{10}$, the set-gen signal or reset-gen signal is also switched to an H level.

Figure 15:
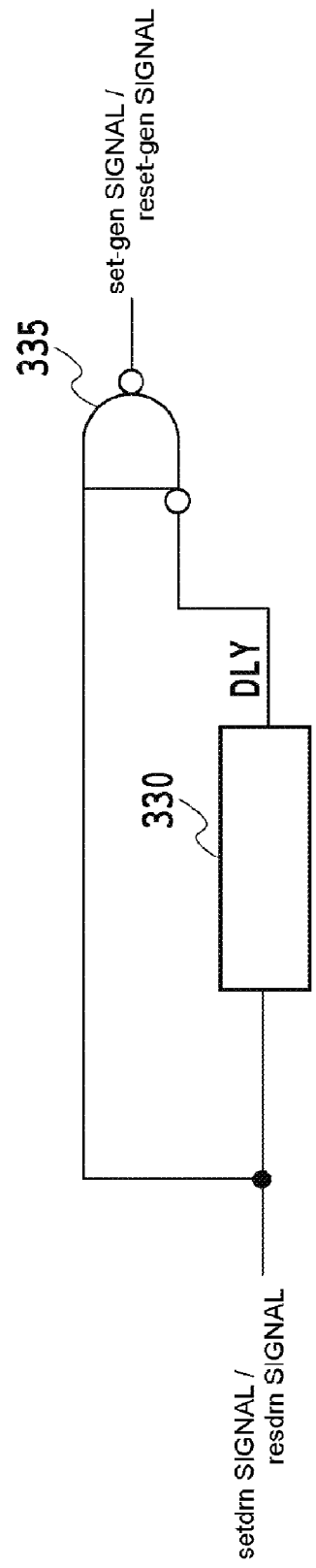
FIG. 15 is a diagram showing another circuit configuration of a rise detector circuit.

FIG. 15 shows another circuit configuration of a rise detector circuit. Hereafter, a description will be given using the first rise detector circuit 321 as an example. The first rise detector circuit 321 according to the other circuit configuration includes the delay circuit 330 and PMOS gate signal connection terminal logic circuit 335. When the setdrn signal is input into the first rise detector circuit 321, the setdrn signal is input into the delay circuit 330 and one input terminal of the PMOS gate signal connection terminal logic circuit 335. The delay circuit 330 delays the input setdrn signal, and inputs it into the other input terminal of the PMOS gate signal connection terminal logic circuit 335 as the delay signal DLY. As the threshold value of the input terminals of the PMOS gate signal connection terminal logic circuit 335 is a potential intermediate between vb and vs, the PMOS gate signal connection terminal logic circuit 335 outputs the set-gen signal at an L level only when the signal level of the setdrn signal is higher than the threshold value and the delay signal DLY is at an L level, and outputs the set-gen signal at an H level at all other times. However, as the threshold value of the input terminals of the PMOS gate signal connection terminal logic circuit 335 is a potential intermediate between vb and vs, there is a drawback in that the time at which the output pulse of the first rise detector circuit 321 changes is delayed, but this drawback is eliminated by lowering the threshold value of the H level side input terminal of the PMOS gate signal connection terminal logic circuit 335.

Figure 16:
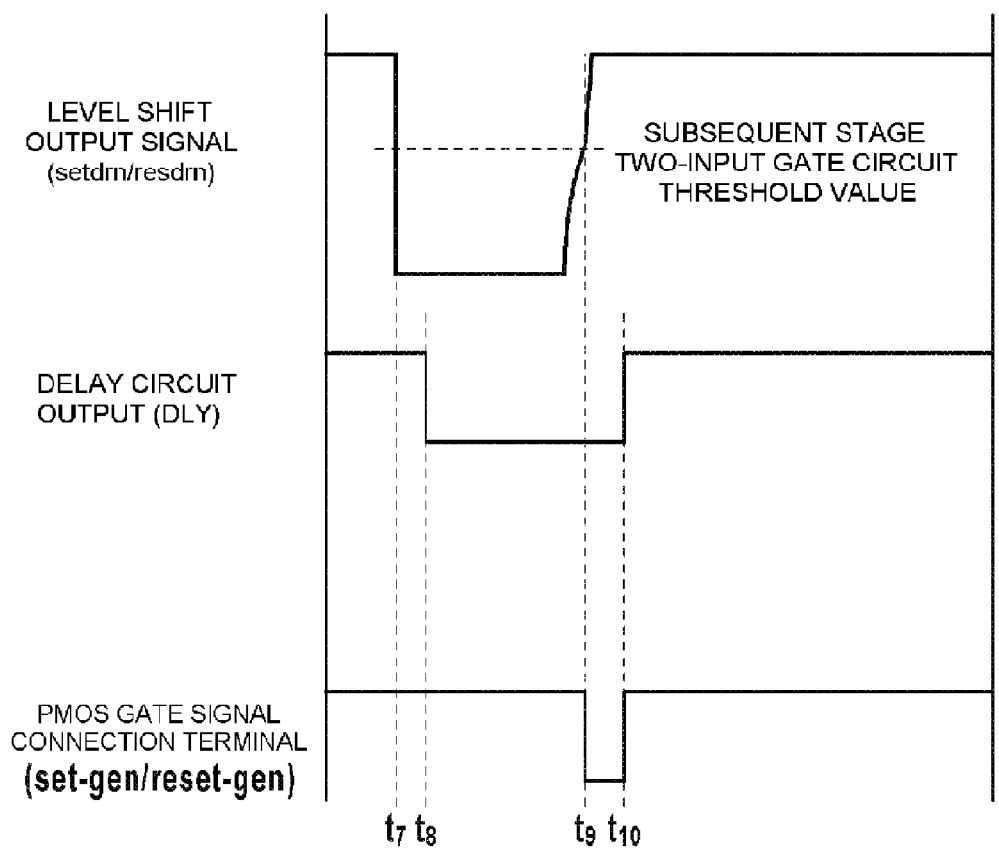
FIG. 16 shows an operation time chart of the rise detector circuit shown in FIG. 15.

FIG. 16 shows an operation time chart of the rise detector circuit shown in FIG. 15. As shown in FIG. 16, the setdrn signal or resdrn signal is switched from an H level to an L level at the time $t_7$. The delay signal DLY is switched from an H level to an L level at the time $t_8$. On the setdrn signal or resdrn signal starting to rise to an H level, and the signal level becoming higher than the threshold value of the input terminals of the PMOS gate signal connection terminal logic circuit 335 at the time $t_9$, the set-gen signal or reset-gen signal is switched from an H level to an L level. Then, as the PM1 or PM2 is turned on, the set-gen signal or reset-gen signal rises swiftly, and the rise time is shortened. On the delay signal DLY switching to an H level at the time $t_{10}$, the set-gen signal or reset-gen signal is also switched to an H level.

Figure 10:
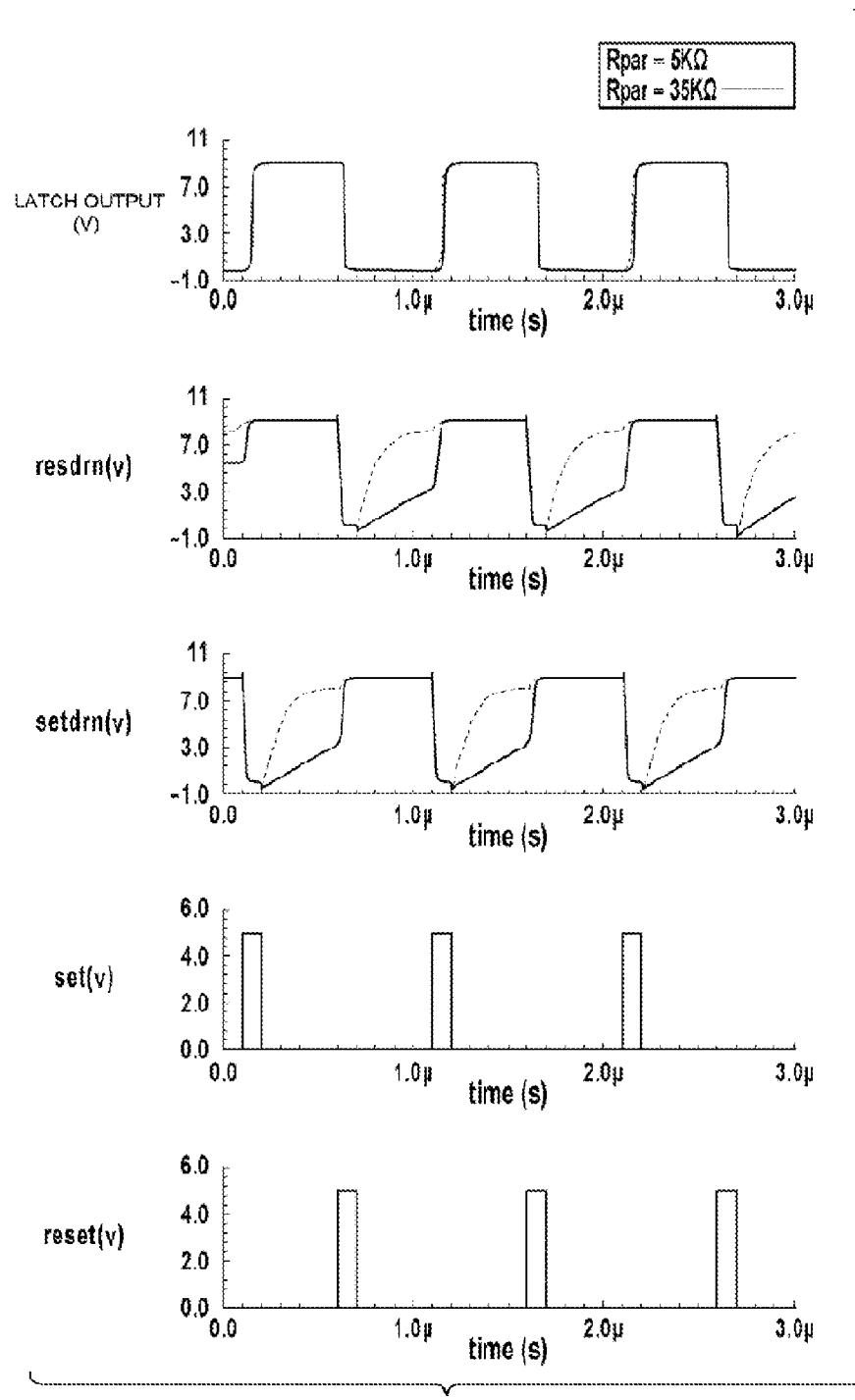
FIG. 10 is a diagram showing circuit simulation results for the half bridge circuit 200 shown in FIG. 3 when the pulse interval between the set signal and reset signal is 0.5 µs.
Figure 11:
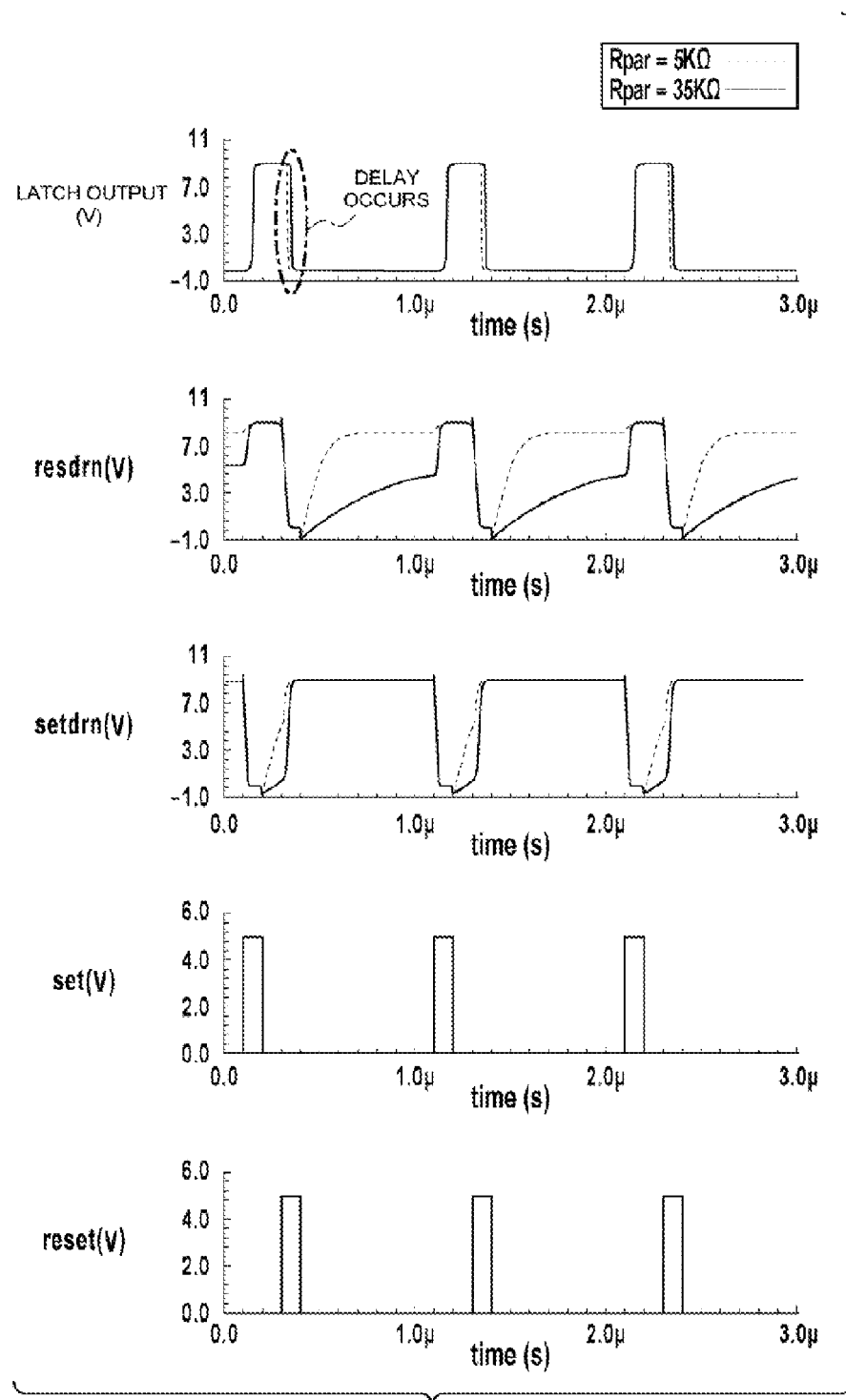
FIG. 11 is a diagram showing circuit simulation results for the half bridge circuit 200 shown in FIG. 3 when the pulse interval between the set signal and reset signal is 0.2 µs.
Figure 17:
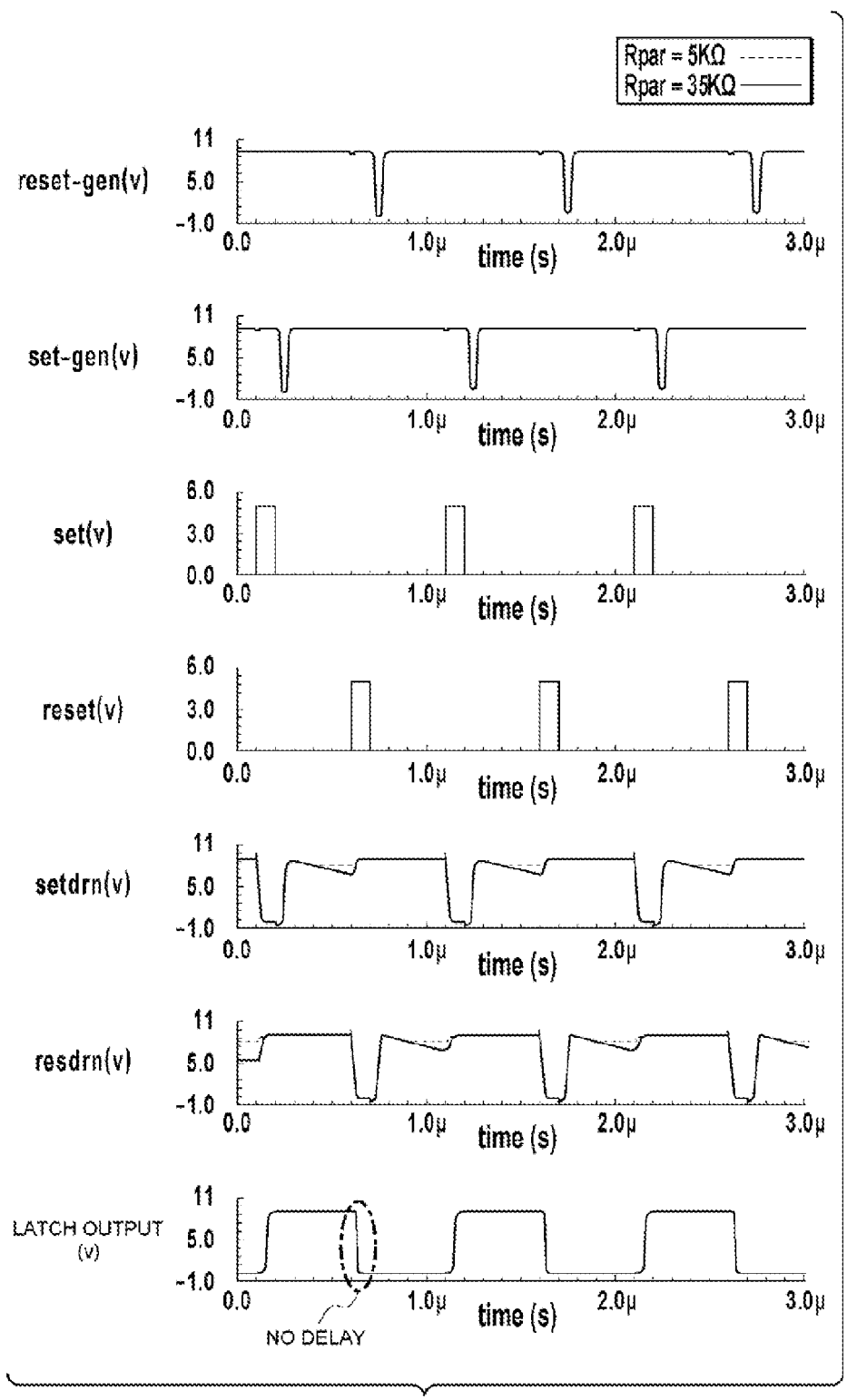
FIG. 17 is a diagram showing the results of a circuit simulation when the pulse interval between a set signal and reset signal is 0.5 µs.
Figure 18:
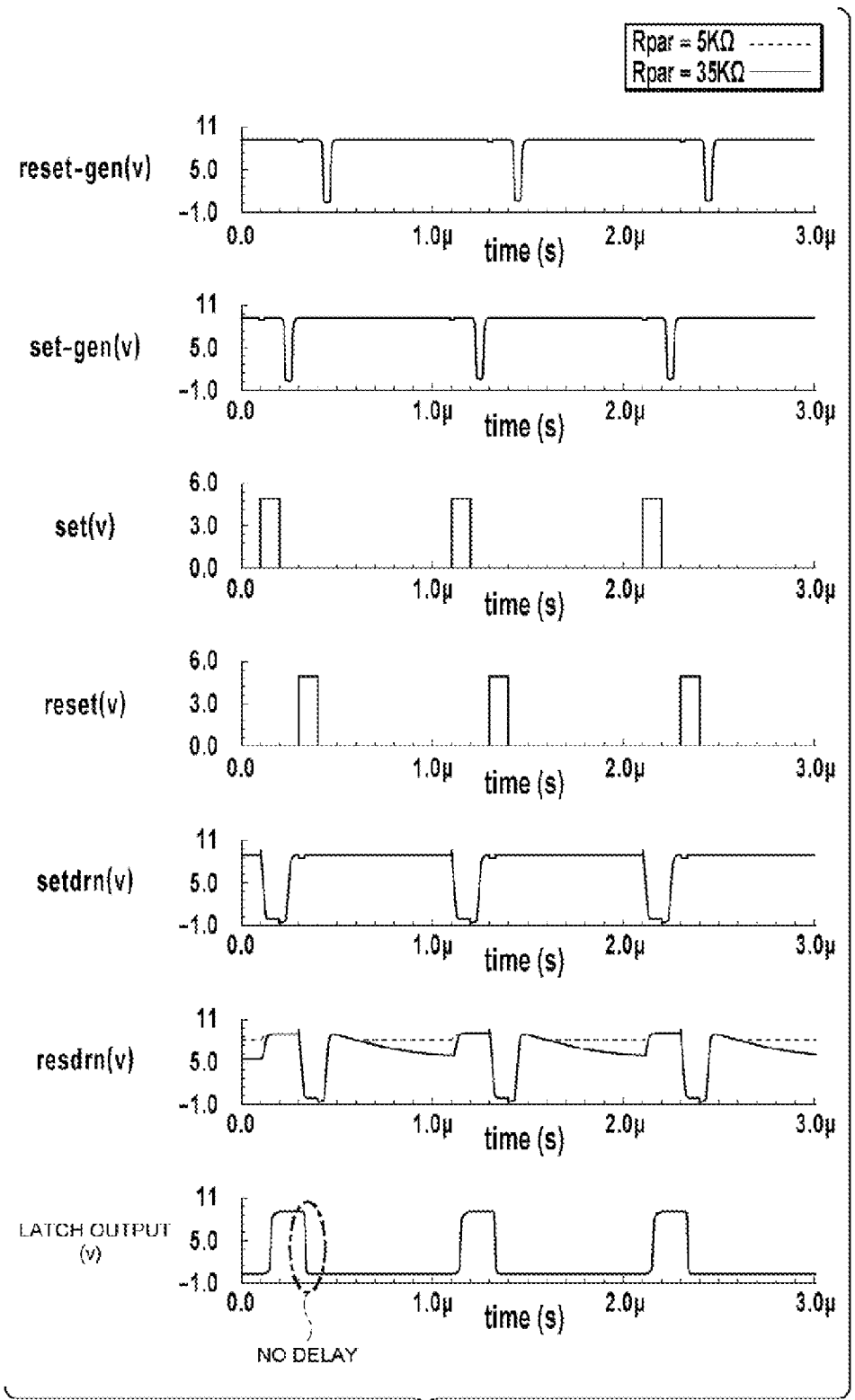
FIG. 18 is a diagram showing the results of a circuit simulation when the pulse interval between a set signal and reset signal is 0.2 µs.

FIG. 17 and FIG. 18 show results of the level shift circuit according to Example 1 shown in FIG. 12 being tested by circuit simulation. FIG. 17 shows the results of a circuit simulation when the pulse interval between a set signal and reset signal is 0.5 μs. As shown in FIG. 17, even when comparing cases in which the resistance values of the parasitic resistors Rpar1 and Rpar2 are 5 kΩ and 35 kΩ, no delay occurs in latch output, which is the same as the simulation results of a heretofore known level shift circuit shown in FIG. 10. FIG. 18 shows the results of a circuit simulation when the pulse interval between the set signal and reset signal is 0.2 μs. Despite the fact the a delay occurs in the latch output in the simulation results of a heretofore known level shift circuit shown in FIG. 11, no delay occurs in the latch output waveform shown in FIG. 18.

Example 2

Figure 19:
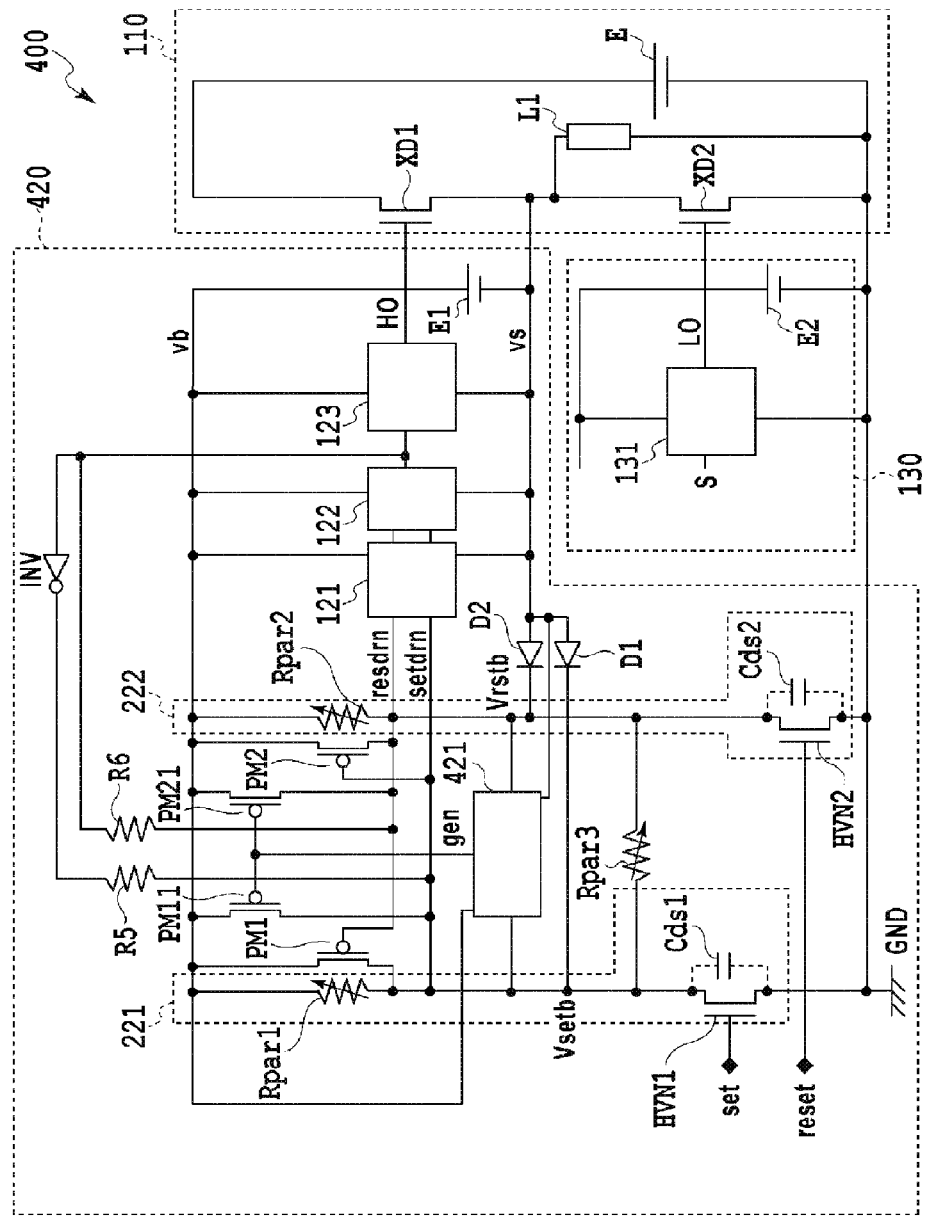
FIG. 19 is a diagram showing a circuit configuration of a half bridge circuit 400 according to Example 2 of the invention.

FIG. 19 is a circuit configuration of a half bridge circuit 400 according to Example 2 of the invention. The basic circuit configuration of the half bridge circuit 400 is the same as that in Example 1. Example 2 differs from Example 1 in that the configuration is such that the first rise detector circuit 321 and second rise detector circuit 322 shown in Example 1 are eliminated, one rise detector circuit 421 is provided instead, the setdrn signal and resdrn signal output from the first series circuit 221 and second series circuit 222 are input into the rise detector circuit 421, and one gen signal output from the rise detector circuit 421 is input into the PM11 and PM21.

Figure 20:
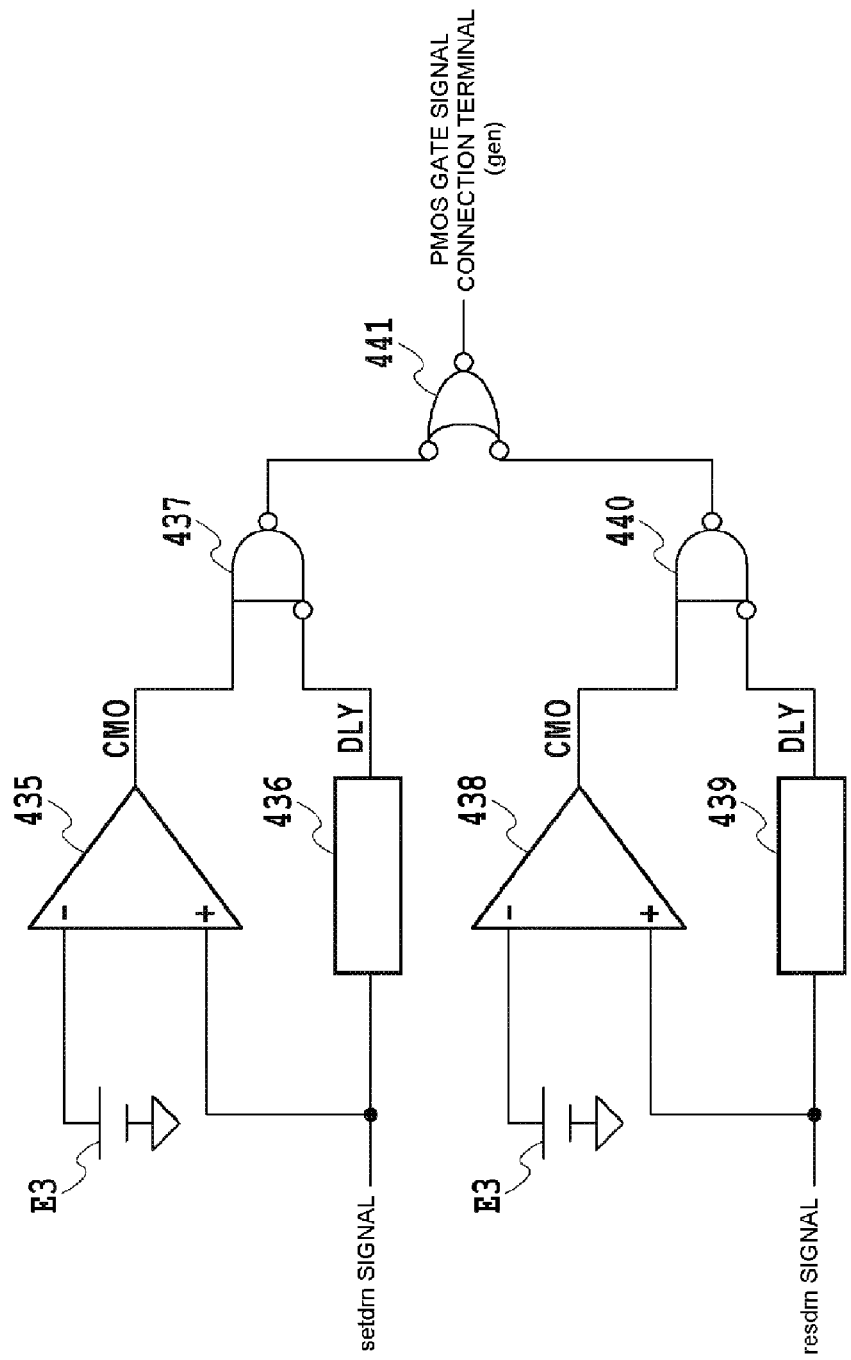
FIG. 20 is a diagram showing a circuit configuration of a rise detector circuit for utilizing the circuit configuration according to Example 2.

FIG. 20 shows a circuit configuration of the rise detector circuit 421 for utilizing the circuit configuration according to Example 2. As shown in FIG. 20, the rise detector circuit 421 of a high potential side drive circuit 420 includes the threshold value voltage source E3, a first comparator 435, a first delay circuit 436, a first logical circuit 437, a second comparator 438, a second delay circuit 439, a second logical circuit 440, and a PMOS gate signal connection terminal logic circuit 441.

The first comparator 435 and first delay circuit 436 are connected to the first series circuit 221, and the setdrn signal is input into each of them. The setdrn signal is input into one input terminal of the first comparator 435, the threshold value voltage E3 is input into the other input terminal, and the first comparator 435 compares the setdrn signal and threshold value voltage E3. The first comparator 435 inputs a comparison signal CMO into the first logic circuit 437, with the comparison signal CMO being at an H level when the signal level of the setdrn signal is higher than the threshold value voltage E3, and with the comparison signal CMO being at an L level when the signal level of the setdrn signal is lower than the threshold value voltage E3.

The first delay circuit 436 delays the input setdrn signal, and outputs it to the first logic circuit 437 as a delay signal DLY.

The comparison signal CMO and delay signal DLY are input into the first logic circuit 437. The input terminal into which the delay signal DLY is input is set to have a function of inverting and inputting the delay signal DLY from the first delay circuit 436, while the output terminal of the first logic circuit 437 has a function of inverting the logical product of the comparison signal CMO from the first comparator 435 and the inverted delay signal DLY, and outputting a signal.

The second comparator 438 and second delay circuit 439 are connected to the second series circuit 222, and the resdrn signal is input into each of them. The resdrn signal is input into one input terminal of the second comparator 438, the threshold value voltage E3 is input into the other input terminal, and the second comparator 438 compares the resdrn signal and threshold value voltage E3. The second comparator 438 inputs a comparison signal CMO into the second logic circuit 440, with the comparison signal CMO being at an H level when the signal level of the resdrn signal is higher than the threshold value voltage E3, and with the comparison signal CMO being at an L level when the signal level of the resdrn signal is lower than the threshold value voltage E3.

The second delay circuit 439 delays the input resdrn signal, and outputs it to the second logic circuit 440 as a delay signal DLY.

The comparison signal CMO and delay signal DLY are input into the second logic circuit 440. The input terminal into which the delay signal DLY is input is set to have a function of inverting and inputting the delay signal DLY from the second delay circuit 439, while the output terminal of the second logic circuit 440 has a function of inverting the logical product of the comparison signal CMO from the second comparator 438 and the inverted delay signal DLY, and outputting a signal.

The PMOS gate signal connection terminal logic circuit 441 inputs a gen signal into the PM11 and PM21, with the gen signal being at an L level in a case in which an output when the comparison signal CMO of the first comparator 435 is at an H level and the delay signal DLY of the second delay circuit 436 is at an L level is input from the first logic circuit 437, and in a case in which an output when the comparison signal CMO of the second comparator 438 is at an H level and the delay signal DLY of the second delay circuit 439 is at an L level is input from the second logic circuit 440, and with the gen signal being at an H level in all other cases.

When applying the rise detector circuit shown in FIG. 20, a temporal restriction (a dead time DT) is provided for the set signal and reset signal.

Figure 21:
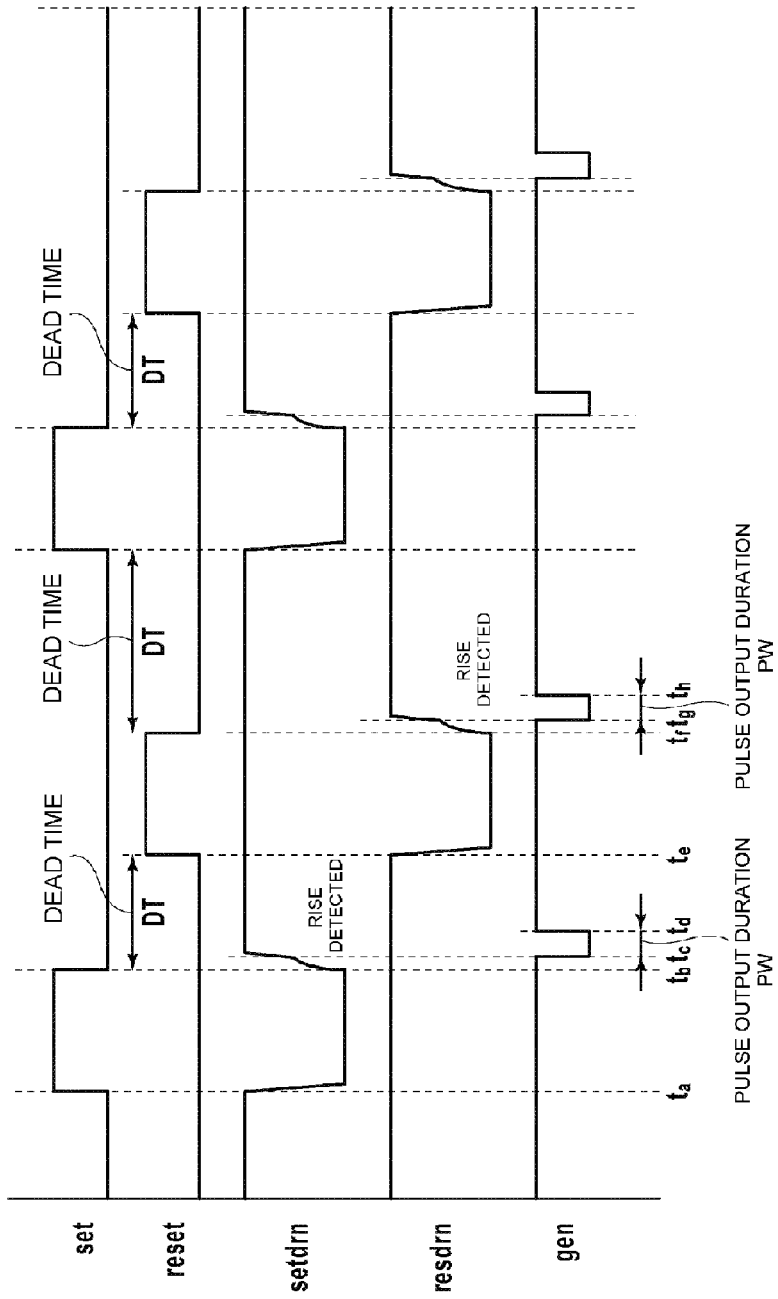
FIG. 21 is a diagram showing the relationship between the pulse intervals of a set signal, reset signal, and gen signal and the output waveforms of a setdrn signal and resdrn signal.

FIG. 21 shows the relationship between the pulse intervals of the set signal, reset signal, and gen signal and the output waveforms of the setdrn signal and resdrn signal. As shown in FIG. 21, on the set signal being switched from an L level to an H level at a time $t_a$, the setdrn signal is switched to an L level. On the set signal being switched from an H level to an L level at a time $t_b$, the setdrn signal starts to rise to an H level, and on the signal level of the setdrn signal becoming higher than the threshold value voltage E3 at a time $t_c$, the gen signal is switched from an H level to an L level. On the delay signal DLY of the first delay circuit switching to an H level at a time $t_d$, the set-gen signal or reset-gen signal is also switched to an H level. On the reset signal being switched from an L level to an H level at a time $t_e$, the resdrn signal is switched to an L level. On the reset signal being switched from an H level to an L level at a time $t_f$, the resdrn signal starts to rise to an H level, and on the signal level of the resdrn signal becoming higher than the threshold value voltage E3 at a time $t_g$, the gen signal is switched from an H level to an L level. On the delay signal DLY of the first delay circuit switching to an H level at a time $t_h$, the gen signal is also switched to an H level.

A dead time period DT is provided for the set signal and reset signal so that the pulses of the two are not superimposed. That is, unless the dead time period DT has elapsed since the fall of one of the set signal or reset signal, the other signal is not raised. Further, a pulse width PW of the gen signal of the rise detector circuit 421 is regulated so as to be equal to or less than DT. The pulse width PW of the gen signal can be regulated by the delay circuit shown in FIG. 20. It is assumed that the output amplitude of the gen signal is of a voltage level such that a turning on and off of the PM11 and PM21 is possible.

Figure 22:
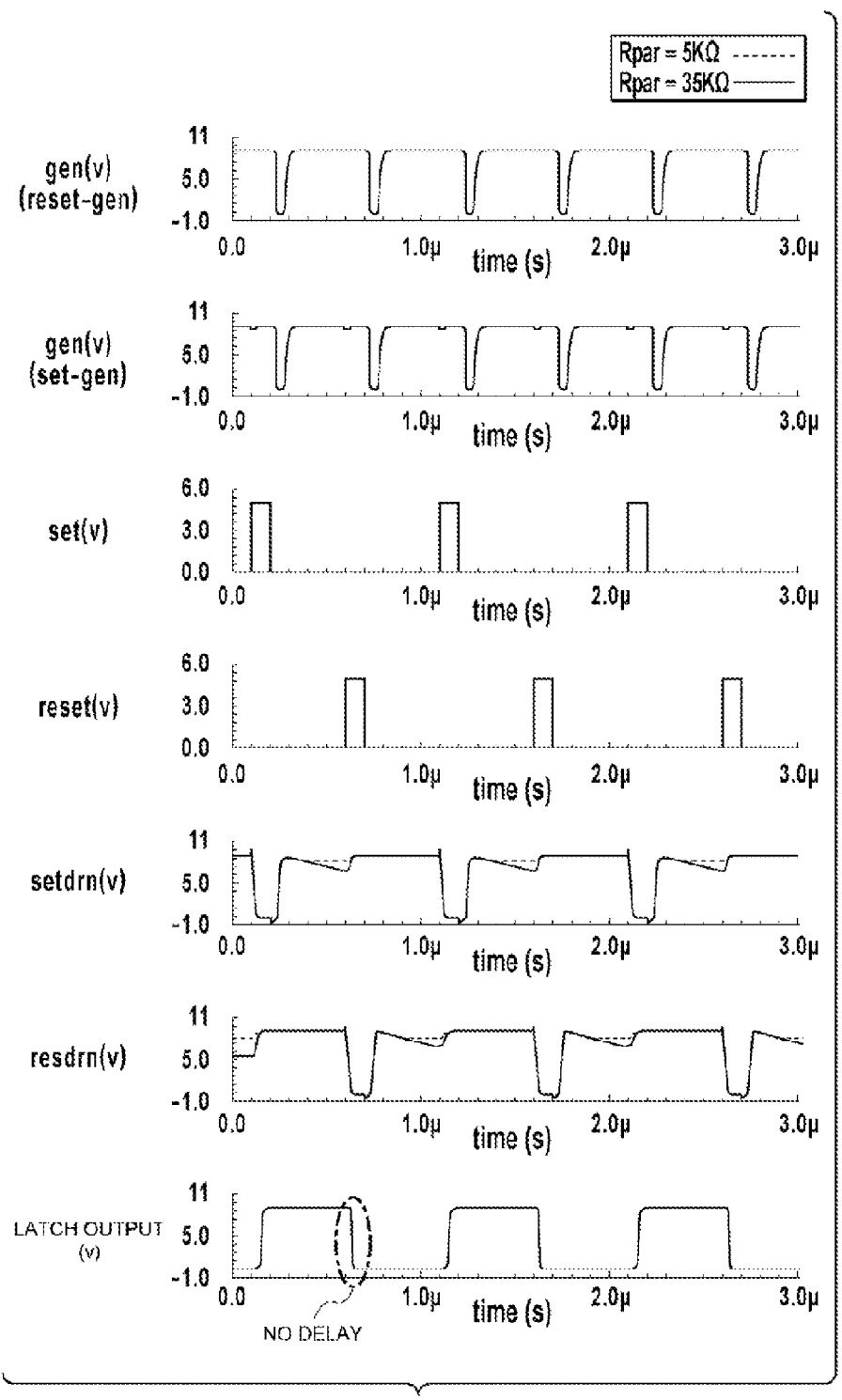
FIG. 22 is a diagram showing circuit simulation results when the pulse interval between the set signal and reset signal is 0.5 µs.
Figure 23:
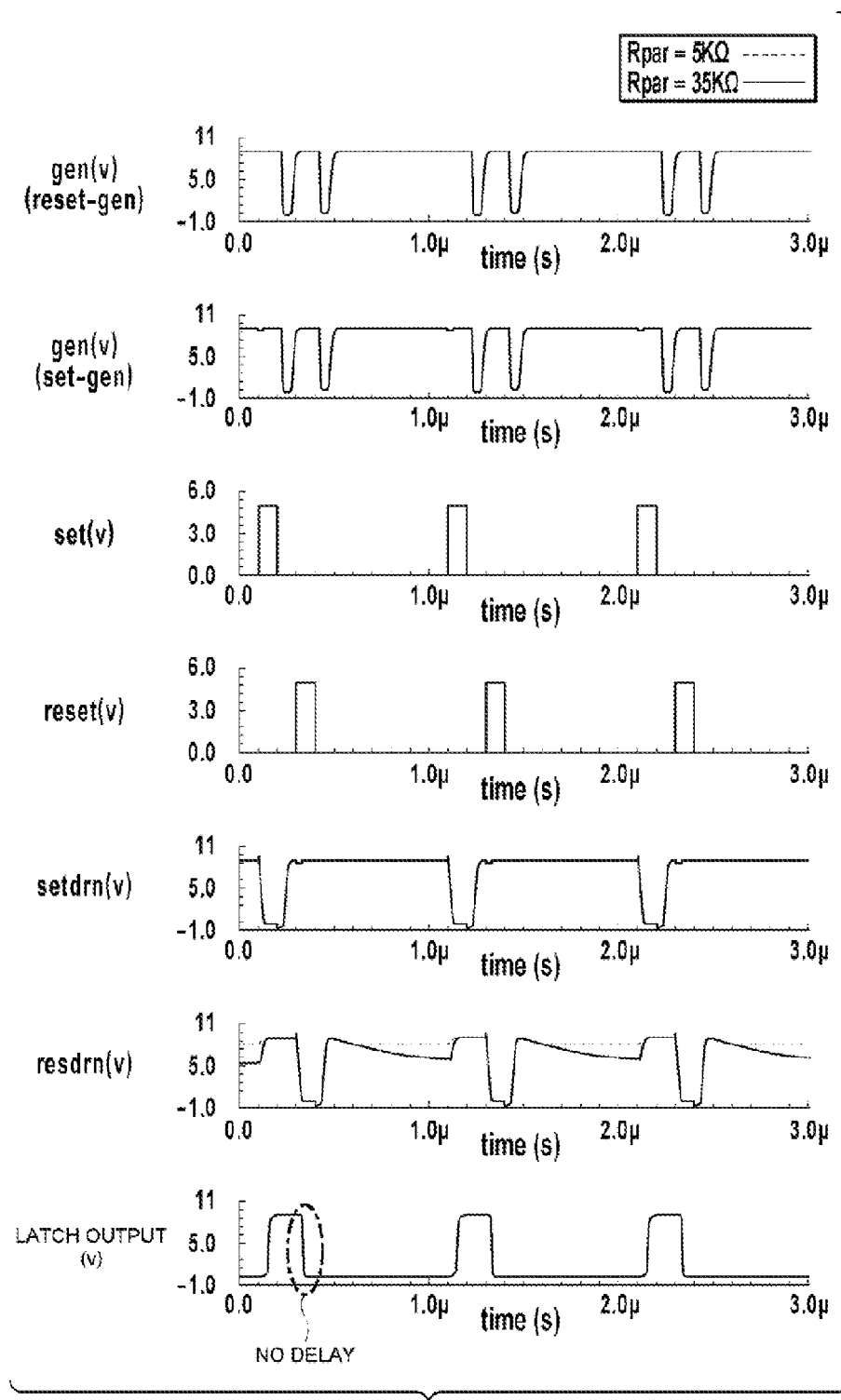
FIG. 23 is a diagram showing circuit simulation results when the pulse interval between the set signal and reset signal is 0.2 µs.

FIG. 22 and FIG. 23 show circuit simulation results for the level shift circuit of FIG. 19. FIG. 22 is the test results when the pulse interval between the set signal and reset signal is 0.5 µs, while FIG. 23 is the test results when the pulse interval between the set signal and reset signal is 0.2 µs. As shown in FIG. 22 and FIG. 23, no delay in latch output due to a difference in parasitic resistance occurs, even when the pulse intervals differ.

There is an advantage in applying the rise detector circuit 421 shown in FIG. 20 in that, even when a rise of the setdrn signal or resdrn signal is detected, the PM11 and PM21 are turned on, the set-gen signal or reset-gen signal rises swiftly, and the rise time is shortened. Owing to a relative operation of the parasitic resistors Rpar1 and Rpar2 and feedback resistors R5 and R6, there is no change in an operation whereby one series circuit is connected in parallel while the other series circuit is connected in series, because of which a relationship between the impedances of the first series circuit 221 and second series circuit 222 wherein one is low while the other is high is maintained, and a relationship such that no malfunction occurs is maintained.

Example 3

Figure 24:
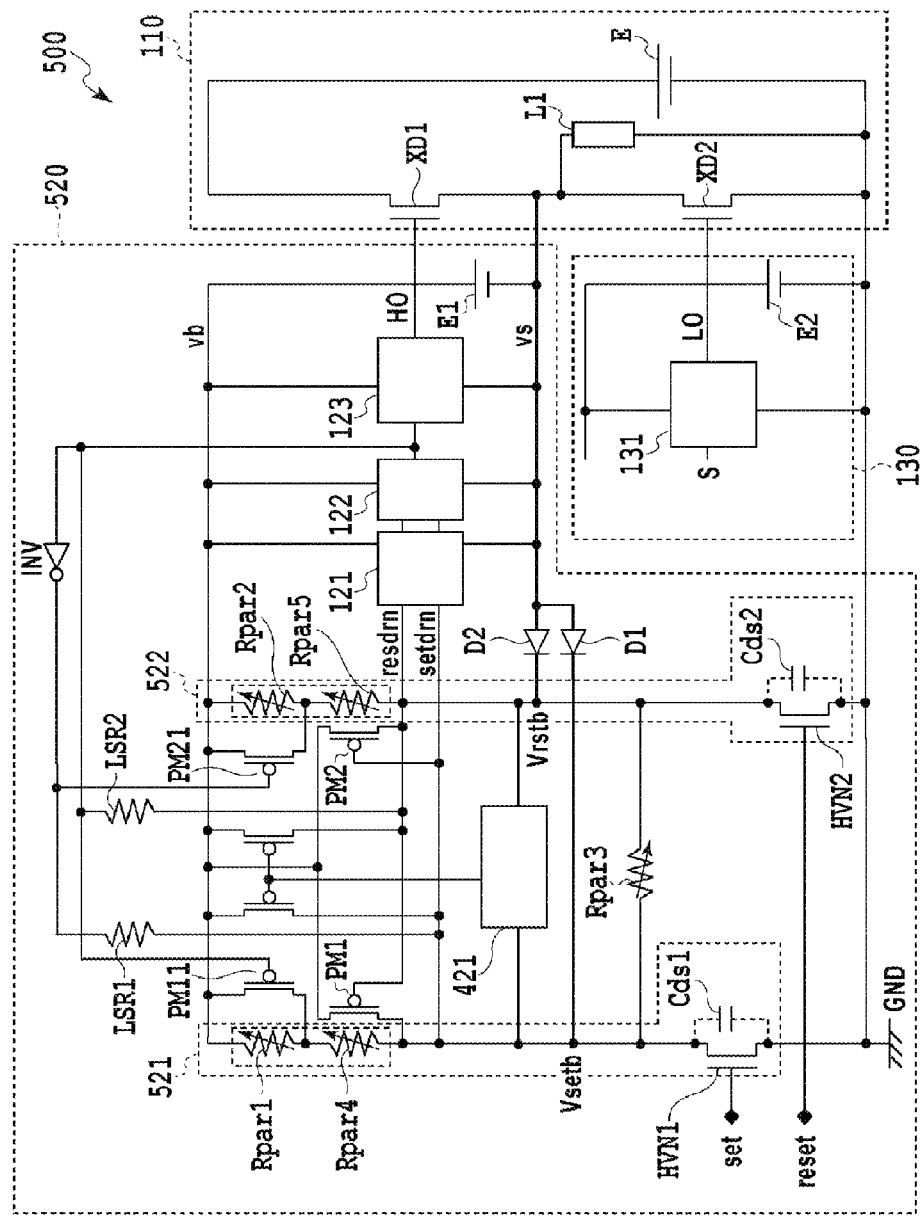
FIG. 24 is a diagram showing a circuit configuration of a half bridge circuit 500 according to Example 3 of the invention.

FIG. 24 shows a circuit configuration of a half bridge circuit 500 according to Example 3 of the invention. The same reference signs are given to regions the same as in FIG. 19, and a detailed description will be omitted. A high potential side drive circuit 520 of the half bridge circuit 500 shown in FIG. 24 is such that a first series circuit 521 is configured using a series circuit of the parasitic resistor Rpar1 and a parasitic resistor Rpar4, while a second series circuit 522 is configured using a series circuit of the parasitic resistor Rpar2 and a parasitic resistor Rpar5. The PM11 and PM21 are connected in parallel to the parasitic resistor Rpar1 and parasitic resistor Rpar2 respectively. The source terminal of the PM1 is connected to a power source line Vb, while the drain terminal is connected to a first connection point Vsetb, and the gate terminal is connected via a second connection point Vrstb and the feedback resistor R6 to the output terminal of a latch circuit 122. The source terminal of the PM2 is connected to the power source line Vb, while the drain terminal is connected to the second connection point Vrstb, and the gate terminal is connected via the first connection point Vsetb and the feedback resistor R5 to the output terminal of an inverter INV.

Figure 25:
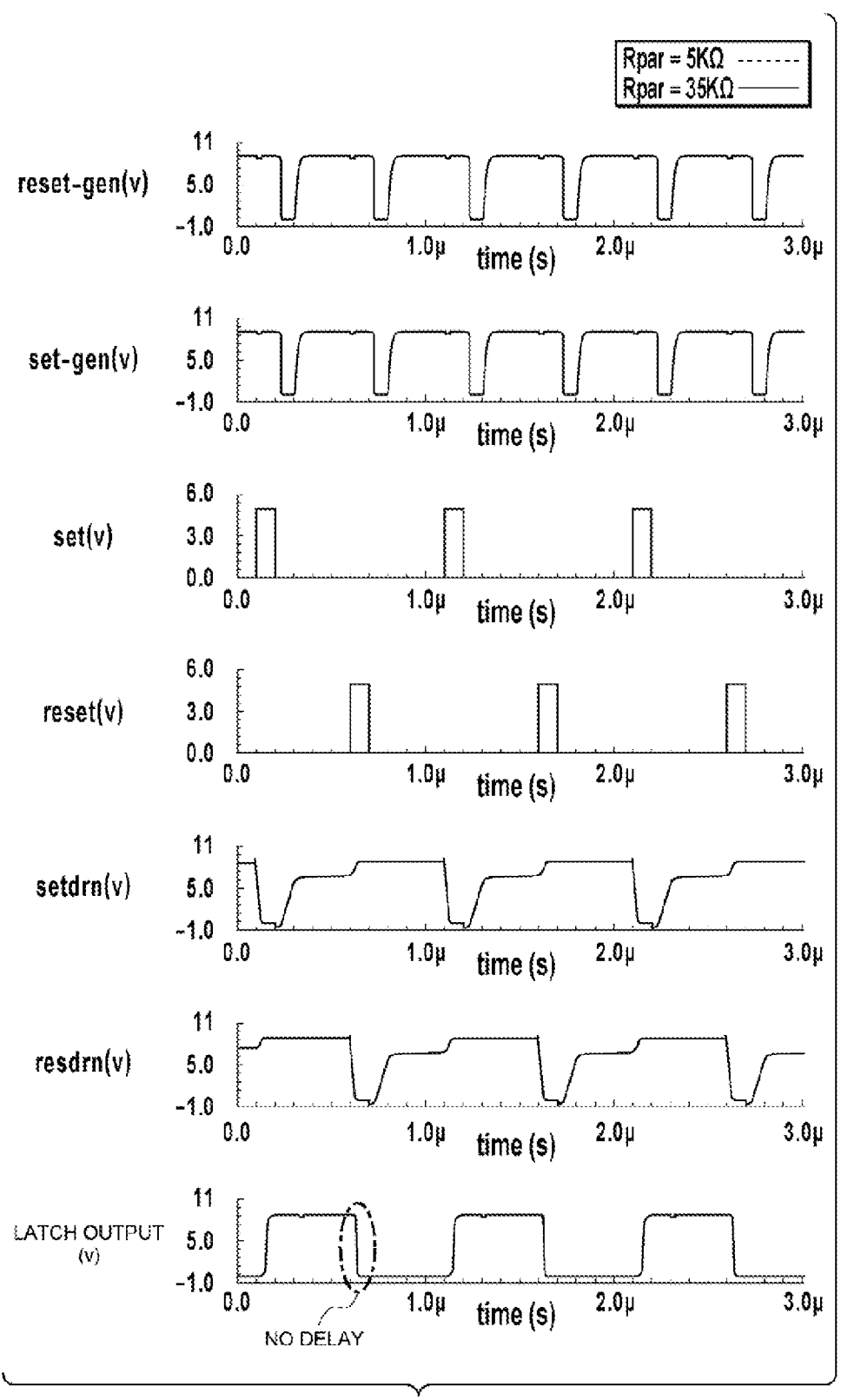
FIG. 25 is a diagram showing circuit simulation results when the pulse interval between the set signal and reset signal is 0.5 µs.
Figure 26:
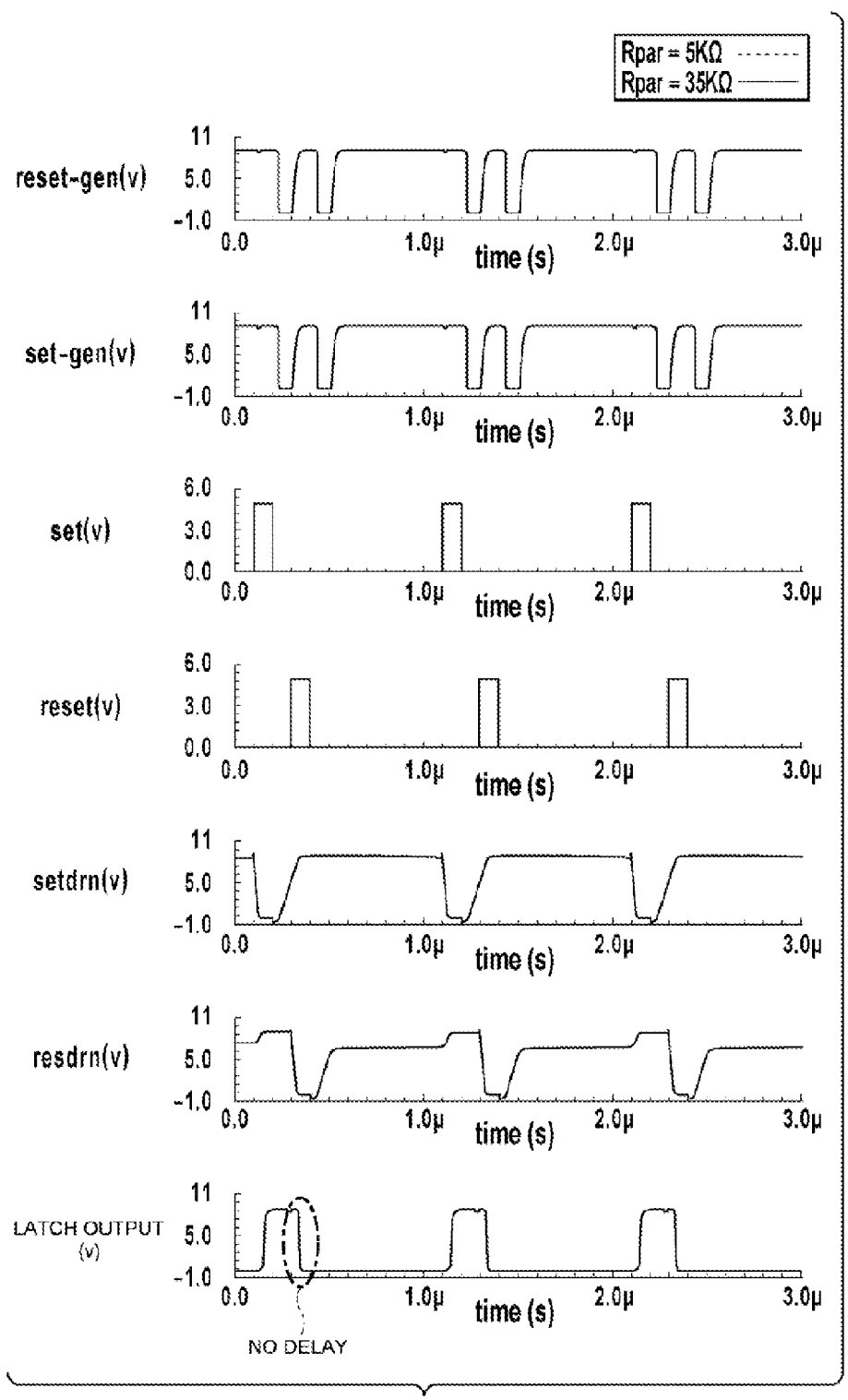
FIG. 26 is a diagram showing circuit simulation results when the pulse interval between the set signal and reset signal is 0.2 µs.

FIG. 25 and FIG. 26 show circuit simulation results for the level shift circuit shown in FIG. 24. FIG. 25 is the test results when the pulse interval between the set signal and reset signal is 0.5 µs, while FIG. 26 is the test results when the pulse interval between the set signal and reset signal is 0.2 µs. As shown in FIG. 25 and FIG. 26, no delay in latch output due to a difference in parasitic resistance occurs, even when the pulse intervals differ.

Industrial Applicability

In the description thus far, the Rpar1, Rpar2, Rpar4, and Rpar5 have been adopted as parasitic resistors in a semiconductor substrate but, the invention not being limited to parasitic resistance, the normal resistance in a semiconductor substrate may be applied instead of the parasitic resistors Rpar1, Rpar2 and Rpar4. Even when these resistors have properties in accordance with FIGS. 4 to 6, the effect thereof can be suppressed by the invention.

The invention claimed is:

1. An apparatus, comprising:
    a first signal output device configured to output a first level shifting signal and including a first resistance;
    a second signal output device configured to output a second level shifting signal and including a second resistance;
    wherein the first level shifting signal and the second level shifting signal are to control an output switching element of a high potential side of an output device comprising a power source and a load;
    a first detector device configured to compare the first level shifting signal to a reference signal and output a first comparison result signal to a first switching element coupled to the first resistance; and
    a second detector device configured to compare the second level shifting signal to the reference signal and output a second comparison result signal to a second switching element coupled to the second resistance;
    wherein
        the first comparison result signal and second comparison result signals are configured to at least partly control switching of the first switching element and the second switching element, and
        each of the resistance and the second resistance is a parasitic resistance in a semiconductor substrate included in the apparatus.

2. The apparatus of claim 1, wherein at least one of the first and detector devices comprises:
    a comparator having the reference signal and one of the first and second level shifting signals as an input; and
    a delay device having one of the first and second level shifting signals as an input.

3. The apparatus of claim 2, wherein at least one of the first and second detector devices further comprises a logic device having an output of the comparator and an output of the delay device as inputs.

* * * * *